US011869929B2

(12) United States Patent
Xia et al.

(10) Patent No.: US 11,869,929 B2
(45) Date of Patent: Jan. 9, 2024

(54) LAMINATED CAPACITOR AND METHOD FOR MANUFACTURING THE SAME

(71) Applicant: CHANGXIN MEMORY TECHNOLOGIES, INC., Anhui (CN)

(72) Inventors: Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 222 days.

(21) Appl. No.: 17/402,735

(22) Filed: Aug. 16, 2021

(65) Prior Publication Data

US 2021/0391414 A1 Dec. 16, 2021

Related U.S. Application Data

(63) Continuation of application No. PCT/CN2021/094216, filed on May 17, 2021.

(30) Foreign Application Priority Data

Jun. 16, 2020 (CN) .......................... 202010550132.7

(51) Int. Cl.
*H10B 12/00* (2023.01)
*H01L 49/02* (2006.01)
(52) U.S. Cl.
CPC .............. *H01L 28/87* (2013.01); *H01L 28/91* (2013.01); *H10B 12/01* (2023.02)
(58) Field of Classification Search
CPC ........ H01L 28/86–89; H01L 28/90–92; H10B 12/00–0335
See application file for complete search history.

(56) References Cited

U.S. PATENT DOCUMENTS 5,753,948 A 5/1998 Nguyen
7,482,648 B2 1/2009 Xianyu
(Continued)

FOREIGN PATENT DOCUMENTS

CN 1674284 A 9/2005
CN 103390541 A 11/2013
(Continued)

OTHER PUBLICATIONS

International Search Report in the international application No. PCT/CN2021/094216, dated Aug. 11, 2021, 2 pgs.
First Office Action of the Chinese application No. 202010550132.7, dated Apr. 28, 2022, 10 pgs.
(Continued)

*Primary Examiner* — Jose R Diaz
(74) *Attorney, Agent, or Firm* — Cooper Legal Group, LLC

(57) ABSTRACT

A laminated capacitor and a method for manufacturing the same are provided. The method includes operations of providing a substrate; forming a first isolation insulation spacer and a plurality of discrete bottom bonding pads on the substrate; forming a sub-capacitor structure on the bottom bonding pads, which comprises a plurality of discrete bottom electrodes, a plurality of discrete top electrodes, and a dielectric medium located between the bottom electrodes and the top electrodes, wherein the plurality of bottom bonding pads are respectively electrically connected with the plurality of bottom electrodes in one-to-one correspondence; and repeatedly performing an operation of forming a connection structure and the sub-capacitor structure for N times on the sub-capacitor structure, such that N connection structures and N+1 sub-capacitor structures are alternately arranged along a direction perpendicular to the substrate, wherein N is an integer greater than or equal to 1.

20 Claims, 31 Drawing Sheets

(56) References Cited

U.S. PATENT DOCUMENTS

| | | |
|---|---|---|
| 7,919,803 B2 | 4/2011 | Yokoi |
| 8,993,396 B2 | 3/2015 | Park |
| 10,153,095 B2 | 12/2018 | Zhou |
| 10,490,361 B2 | 11/2019 | Camilo et al. |
| 10,825,815 B2 | 11/2020 | Tang et al. |
| 11,469,168 B2 * | 10/2022 | Lu .......................... H01L 28/75 |
| 2005/0139882 A1 | 6/2005 | Xianyu |
| 2009/0078981 A1 | 3/2009 | Yokoi |
| 2012/0193761 A1 | 8/2012 | Park |
| 2013/0299942 A1 | 11/2013 | Park |
| 2015/0221718 A1 | 8/2015 | Rhie |
| 2017/0169958 A1 | 6/2017 | Zhou |
| 2018/0323200 A1 | 11/2018 | Tang et al. |
| 2019/0074141 A1 | 3/2019 | Zhou |
| 2020/0411522 A1 | 12/2020 | Tang et al. |

FOREIGN PATENT DOCUMENTS

| | | |
|---|---|---|
| CN | 105206421 A | 12/2015 |
| CN | 106876152 A | 6/2017 |
| CN | 110459533 A | 11/2019 |
| CN | 110504284 A | 11/2019 |
| CN | 110574160 A | 12/2019 |
| CN | 110957303 A | 4/2020 |
| CN | 210296415 U | 4/2020 |
| JP | 2005117004 A | 4/2005 |

OTHER PUBLICATIONS

International Search Report in the international application No. PCT/CN2021/098706, dated Sep. 15, 2021, 2 pgs.

* cited by examiner

ND METHOD FOR MANUFACTURING THE SAME

LAMINATED CAPACITOR AND METHOD FOR MANUFACTURING THE SAME

CROSS-REFERENCE TO RELATED APPLICATIONS

The present application is a continuation application of International Application No. PCT/CN2021/094216, filed on May 17, 2021, which claims the priority to Chinese Patent Application No. 202010550132.7, filed on Jun. 16, 2020. International Application No. PCT/CN2021/094216 and Chinese Patent Application No. 202010550132.7 are hereby incorporated by reference in their entireties.

BACKGROUND

The Dynamic Random Access Memory (DRAM) is a common semiconductor memory device in a computer and is composed of a plurality of storage units. Each storage unit includes a capacitor and a transistor. A gate of the transistor is electrically connected with a word line, a first electrode of the transistor is electrically connected with a bit line, and a second electrode of the transistor is electrically connected with the capacitor. A voltage signal on the word line can control the transistor to be turned on and off. Information stored in the capacitor may be read through the bit line, or data information may be written into the capacitor through the bit line, when the transistor is turned on.

FIG. 1 is a structural schematic diagram of a capacitor provided by the related art. Referring to FIG. 1, the capacitor includes a top electrode 110', a dielectric medium 120', and a plurality of discrete bottom electrodes 130'. Each bottom electrode 130' is electrically connected with a bottom bonding pad 20', the top electrode 110' is electrically connected with a top bonding pad 30', and two adjacent bottom bonding pads 20' are insulated by an insulation isolation spacer 40'. However, a capacitance value of the capacitor shown in FIG. 1 is relatively small, and how to improve the capacitance value of the capacitor becomes a technical difficulty.

SUMMARY

The present application relates to the technical field of a semiconductor integrated circuit, and particularly, to a laminated capacitor and a method for manufacturing the same.

In a first aspect, an embodiment of the present disclosure provides a method for manufacturing a laminated capacitor. The method includes operations of providing a substrate; forming a first isolation insulation spacer and a plurality of discrete bottom bonding pads arranged in the first isolation insulation spacer on the substrate; forming a first sub-capacitor structure on the first isolation insulation spacer and the bottom bonding pads, which comprises a plurality of discrete bottom electrodes, a plurality of discrete top electrodes, and a dielectric medium located between the bottom electrodes and the top electrodes, wherein the plurality of bottom bonding pads are respectively electrically connected with the plurality of bottom electrodes in one-to-one correspondence; and performing an operation of sequentially forming a $n^{th}$ connection structure and a $n^{th}$ sub-capacitor structure on the first sub-capacitor structure from n=1 to n=N, wherein N is an integer greater than or equal to 1, wherein the laminated capacitor finally has N connection structures and N+1 sub-capacitor structures which are alternately arranged along a direction perpendicular to the substrate.

In a second aspect, an embodiment of the present disclosure also provides a laminated capacitor. The laminated capacitor includes: a substrate; a first isolation insulation spacer and a plurality of discrete bottom bonding pads arranged in the first isolation insulation spacer on the substrate; N connection structures and N+1 sub-capacitor structures located on the first isolation insulation spacer and the bottom bonding pads, wherein N is an integer greater than or equal to 1, and the N+1 sub-capacitor structures and the N connection structures are alternately arranged along a direction perpendicular to the substrate; in which each of the sub-capacitor structures comprises a plurality of discrete bottom electrodes, a plurality of discrete top electrodes, and a dielectric medium between the bottom electrodes and the top electrodes; and the plurality of bottom bonding pads are respectively electrically connected with the plurality of bottom electrodes of a sub-capacitor structure adjacent to the plurality of bottom bonding pads in one-to-one correspondence.

DETAILED DESCRIPTION

Figure 1:
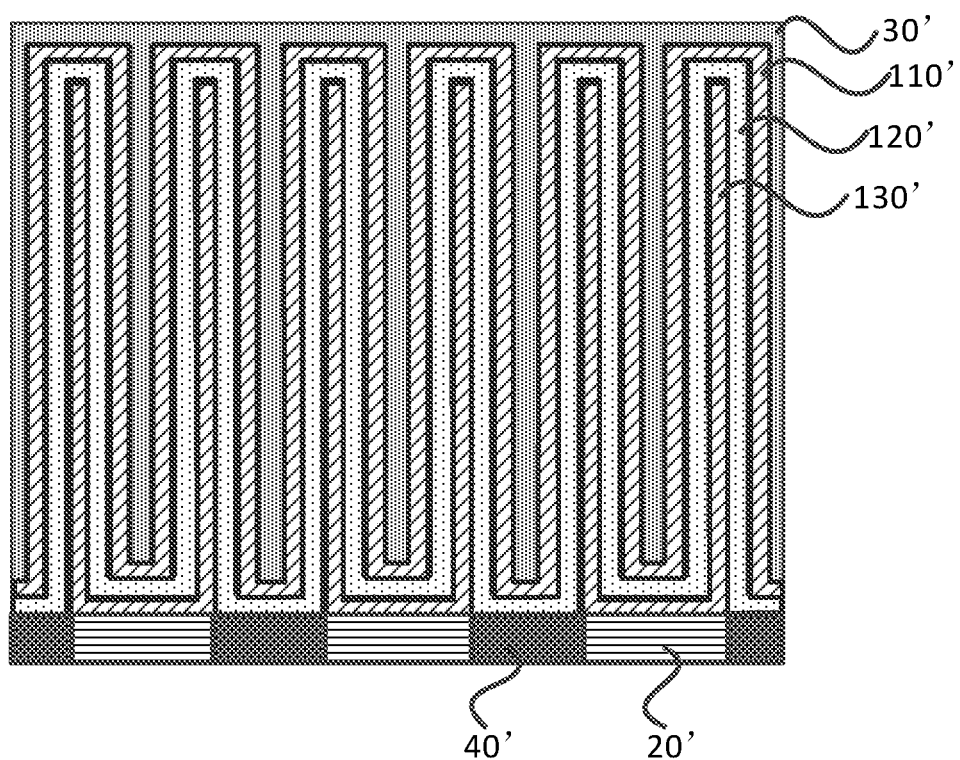
FIG. 1 is a structural schematic diagram of a capacitor provided by the related art.

The present disclosure is explained in more detail below in combination with the accompanying drawings and examples. It is to be understood that the specific examples described herein are merely illustrative of the present disclosure and are not a limitation of the present disclosure. It is also to be noted that, for convenience of description, only some, but not all, of the structures related to the present disclosure are shown in the drawings.

The terms used in the examples of the present disclosure are for the purpose of describing the specific examples only and are not intended to limit the present disclosure. It is to be noted that the orientation words "upper", "lower", "left", "right", and the like described in the examples of the present disclosure are described from an angle shown by the drawings and should not be construed as a limitation of the examples of the present disclosure. Furthermore, in the context, it is to be understood that when an element is referred to as being formed "on" or "under" another element, it can be formed not only directly "on" or "under" another element, but may also be formed indirectly "on" or "under" another element through an intervening element. The terms "first", "second", and the like are used for the purpose of description only, and do not indicate any order, quantity, or importance, but are only used to distinguish different components. The specific meaning of the above terms in the present disclosure will be understood by those of ordinary skill in the art according to specific conditions.

Figure 2:
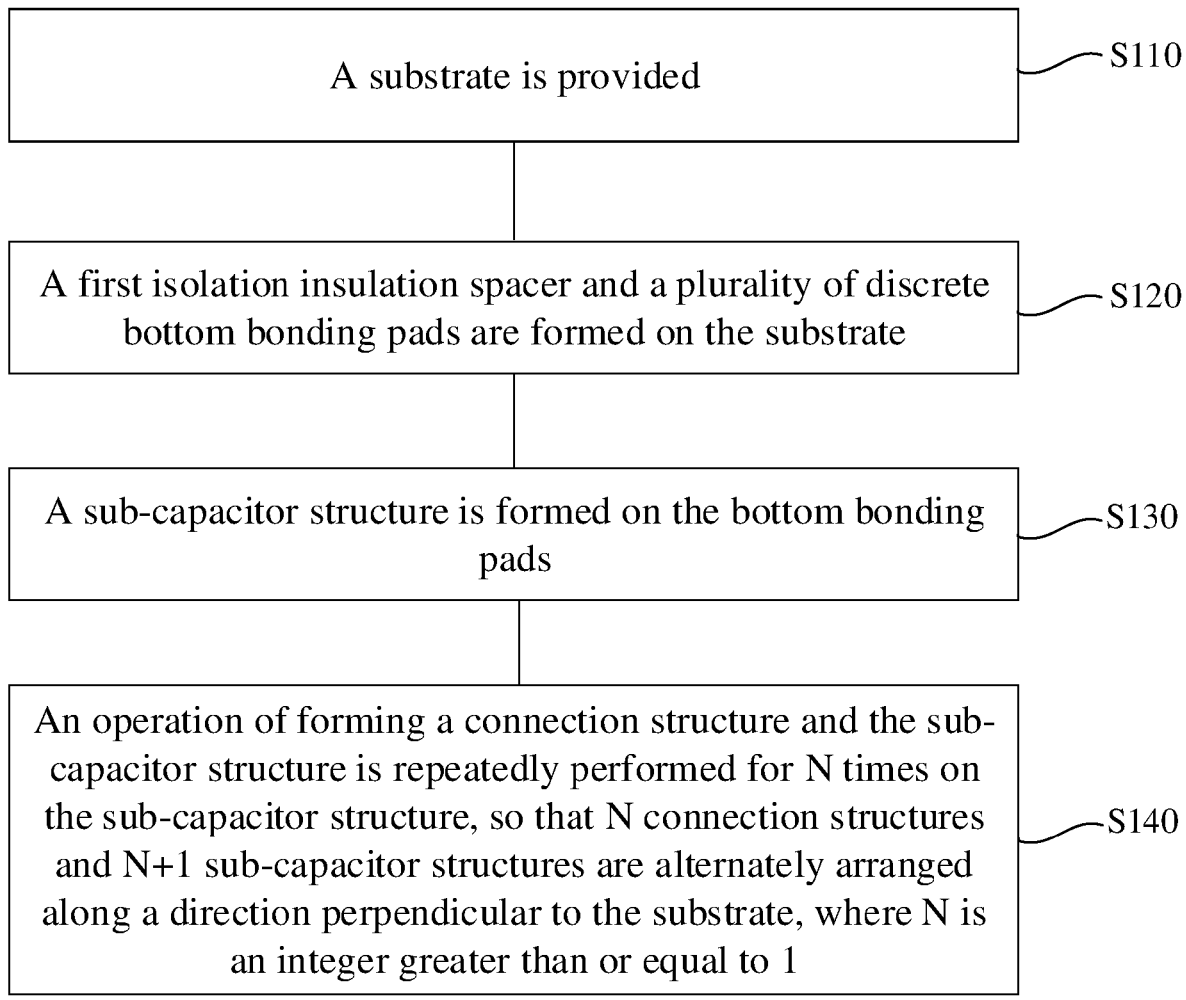
FIG. 2 is a flow chart of a method for manufacturing a laminated capacitor provided by an example of the present disclosure.

FIG. 2 is a flow chart of a method for manufacturing a laminated capacitor provided by an example of the present disclosure. Referring to FIG. 2, the manufacturing method specifically includes the following operations.

At S110, a substrate is provided.

At S120, a first isolation insulation spacer and a plurality of discrete bottom bonding pads are formed on the substrate.

Figure 3:
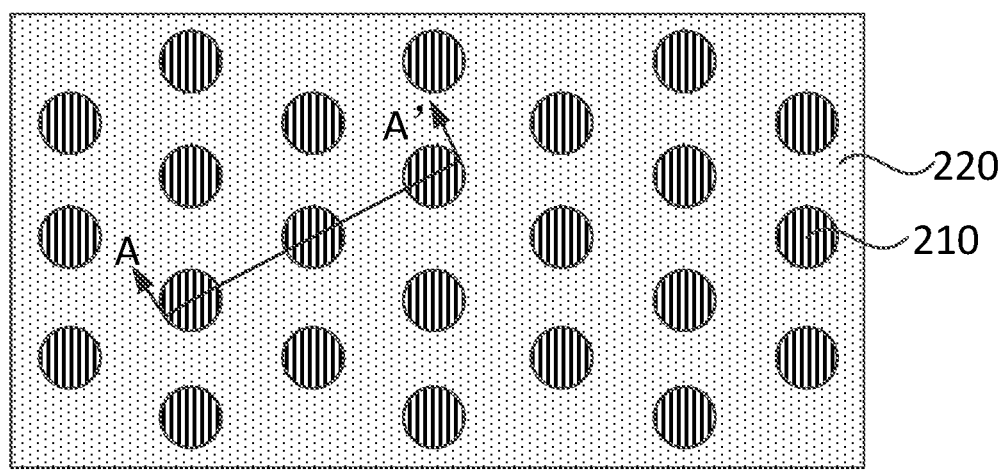
FIG. 3 is a plan top view provided by an example of the present disclosure after a first isolation insulation spacer and a bottom bonding pad are disposed on a substrate.
Figure 4:
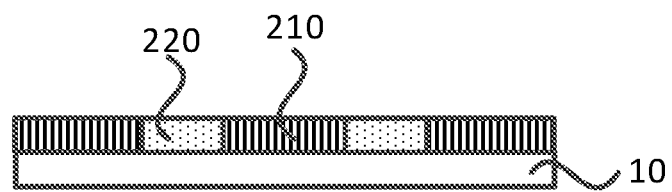
FIG. 4 is a cross-sectional view along a direction AA' in FIG. 3.

In some embodiments, FIG. 3 is a plan top view provided by an example of the present disclosure after a first isolation insulation spacer and a bottom bonding pad are disposed on the substrate. FIG. 4 is a cross-sectional view along a direction AA' in FIG. 3. Referring to FIG. 3 and FIG. 4, any two bottom bonding pads 210 are spaced by the first isolation insulation spacer 220. In other words, orthographic projections of any two bottom bonding pads 210 on the substrate 10 do not overlap, so that each bottom bonding pad 210 is electrically insulated from each other.

Specifically, material, a thickness and a preparation process of the first isolation insulation spacer 220 may be arranged by those skilled in the art according to a practical situation, and are not limited herein. In an embodiment, the material of the first isolation insulation spacer 220 may be silicon nitride, formed through adoption of atomic layer deposition (ALD). In addition, material, a width, and a preparation process of the bottom bonding pad 210 may be arranged by those skilled in the art according to a practical situation, and are not limited herein.

It is to be noted that FIG. 3 only exemplarily shows a plurality of bottom bonding pads 210 arranged in a hexagonal array on the substrate 10 (referring to FIG. 4), but is not a limitation of the present disclosure. Those skilled in the art would be able to arrange an arrangement manner of the bottom bonding pads 210 according to a practical situation.

At S130, a sub-capacitor structure is formed on the surfaces of the bottom bonding pads away from the substrate.

Figure 5:
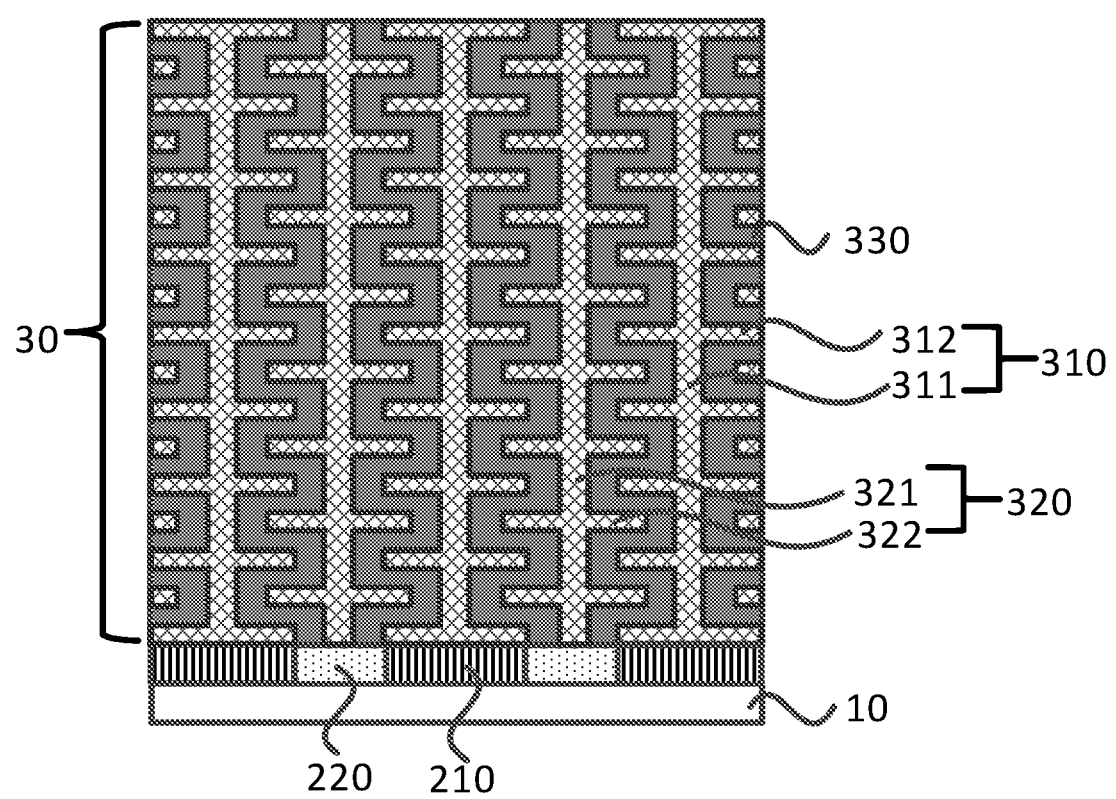
FIG. 5 is a schematic diagram provided by an example of the present disclosure after a sub-capacitor structure is formed.

In some embodiments, FIG. 5 is a schematic diagram provided by an example of the present disclosure after a sub-capacitor structure is formed. Referring to FIG. 5, the sub-capacitor structure 30 includes a plurality of discrete bottom electrodes 310, a plurality of discrete top electrodes 320, and a dielectric medium 330 between the bottom electrodes 310 and the top electrodes 320. The plurality of bottom bonding pads 210 are electrically connected with the plurality of bottom electrodes 310 in one-to-one correspondence. Specifically, both the top electrodes 320 and the bottom electrodes 310 extend along a direction perpendicular to the substrate 10, and the orthographic projections of the top electrodes 320 on the substrate 10 and the orthographic projections of the bottom electrodes 310 on the substrate 10 at least partially do not overlap. Each bottom electrode 310 corresponds to a bottom bonding pad 210, so that the orthographic projection of the bottom electrode 310 on the substrate 10 and the orthographic projection of the corresponding bottom bonding pad 210 on the substrate 10 at least partially overlap. For any top electrode 320, it is not in contact with the bottom bonding pad 210, but in contact with the first isolation insulation spacer 220.

It is to be noted that FIG. 5 exemplarily shows that both the bottom electrodes 310 and the top electrodes 320 are umbrella-shaped structures. That is, each bottom electrode 310 includes a first columnar body 311 and multilayer first annular side wings 312 connected to the first columnar body 311, and each top electrode 320 includes a second columnar body 321 and multilayer second annular side wings 322 connected to the second columnar body 321, but this is not a limitation of the present disclosure. Those skilled in the art may arrange structures of the top electrodes 320 and the bottom electrodes 310 according to a practical situation. For example, in other examples, it may also be arranged that a bottom electrode includes only a first columnar body, and a top electrode includes only a second columnar body. It will be appreciated that through an arrangement of the top electrodes 320 and the bottom electrodes 310 to be the umbrella-shaped structures allows the bottom electrodes 310 and the top electrodes 320 to have uneven surfaces, and further allows the effective area of the bottom electrodes 310 and the top electrodes 320 to be increased, thereby improving the charge storage capacity of the laminated capacitor.

At S140, the operation of forming a connection structure and the sub-capacitor structure is repeatedly performed for N times on the sub-capacitor structure, so that N connection structures and N+1 sub-capacitor structures are alternately arranged along the direction perpendicular to the substrate, where N is an integer greater than or equal to 1.

Figure 6:
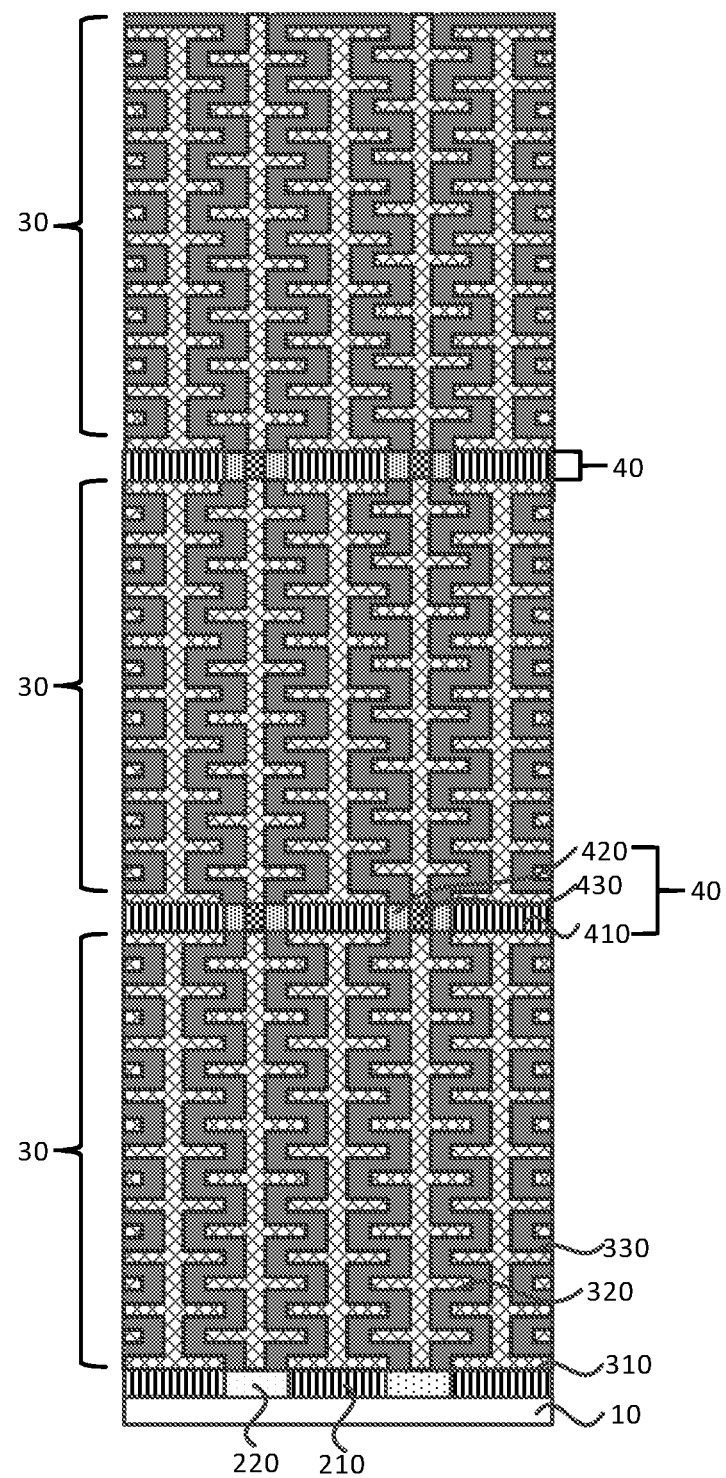
FIG. 6 is a structural schematic diagram of a laminated capacitor provided by an example of the present disclosure.

In some embodiments, FIG. 6 is a structural schematic diagram of a laminated capacitor provided by an example of the present disclosure. Referring to FIG. 6, the connection structure 40 includes a second isolation insulation spacer 420, a plurality of discrete bottom electrode connection spacers 410, and a plurality of discrete top electrode connection spacers 430. Any one bottom electrode connection spacer 410 and any one top electrode connection spacer 430, any two bottom electrode connection spacers 410, and any two top electrode connection spacers 430 are respectively spaced by the second isolation insulation spacer 420. Along the direction perpendicular to the substrate 10, each bottom electrode connection spacer 410 is electrically connected to two bottom electrodes 310 adjacent to the bottom electrode connection spacer 410, and each top electrode connection spacer 430 is electrically connected to two top electrodes 320 adjacent to the top electrode connection spacer 430. Specifically, the orthographic projection of any one bottom electrode connection spacer 410 on the substrate 10 and the orthographic projection of any one top electrode connection spacer 430 on the substrate 10 do not overlap; the orthographic projections of any two bottom electrode connection spacers 410 on the substrate 10 do not overlap; and the orthographic projections of any two top electrode connection spacers 430 on the substrate 10 do not overlap. Specifically, the orthographic projection of any bottom electrode connection spacer 410 on the substrate 10 and the orthographic projection of two bottom electrodes 310 adjacent to the bottom electrode connection spacer 410 on the substrate 10 at least partially overlap; and the orthographic projection of any top electrode connection spacer 430 on the substrate 10 and the orthographic projection of two top electrodes 320 adjacent to the top electrode connection spacer 430 on the substrate 10 at least partially overlap.

In some embodiments, a width of the top electrode connection spacers 430 is the same as that of the second columnar bodies 321 (refer to FIG. 5). Specifically, a length of the top electrode connection spacers 430 along the direction perpendicular to the extension of the second columnar bodies 321 is the same as that of the second columnar bodies 321 in the direction perpendicular to the extension thereof, to reduce occupied area of the top electrode connection spacer 430.

In some embodiments, each bottom electrode connection spacer 410 is in direct contact with the first annular side swings 312 (referring to FIG. 5) of the bottom electrode 310 the sub-capacitor structure 30 adjacent to the bottom electrode connection spacer 410, in order to increase a process alignment window. Specifically, each bottom electrode connection spacer 410 is in direct contact with the first annular side swing 312 of the corresponding bottom electrode 310 of the sub-capacitor structure 30 above the bottom electrode connection spacers 410, and at the same time, each bottom electrode connection spacer 410 is in direct contact with the first annular side swing 312 of the corresponding bottom electrode 310 of the sub-capacitor structure 30 below the bottom electrode connection spacer 410.

In some embodiments, the projection of an edge of each bottom electrode connection spacer 410 and an edge of the corresponding first annular side wing 312 on the substrate 10 coincide, to reduce the occupied area of the bottom electrode connection spacers 410 and ensure good contact.

In some embodiments, material of the top electrode connection spacers 430 is the same as that of the top electrodes 320. For example, both the material of the top electrode connection spacers 430 and the material of the top electrodes 320 are a conductive material such as titanium nitride, and the like. Through adoption of the same material, contact resistance may be reduced, and the device performance may be improved.

Figure 31:
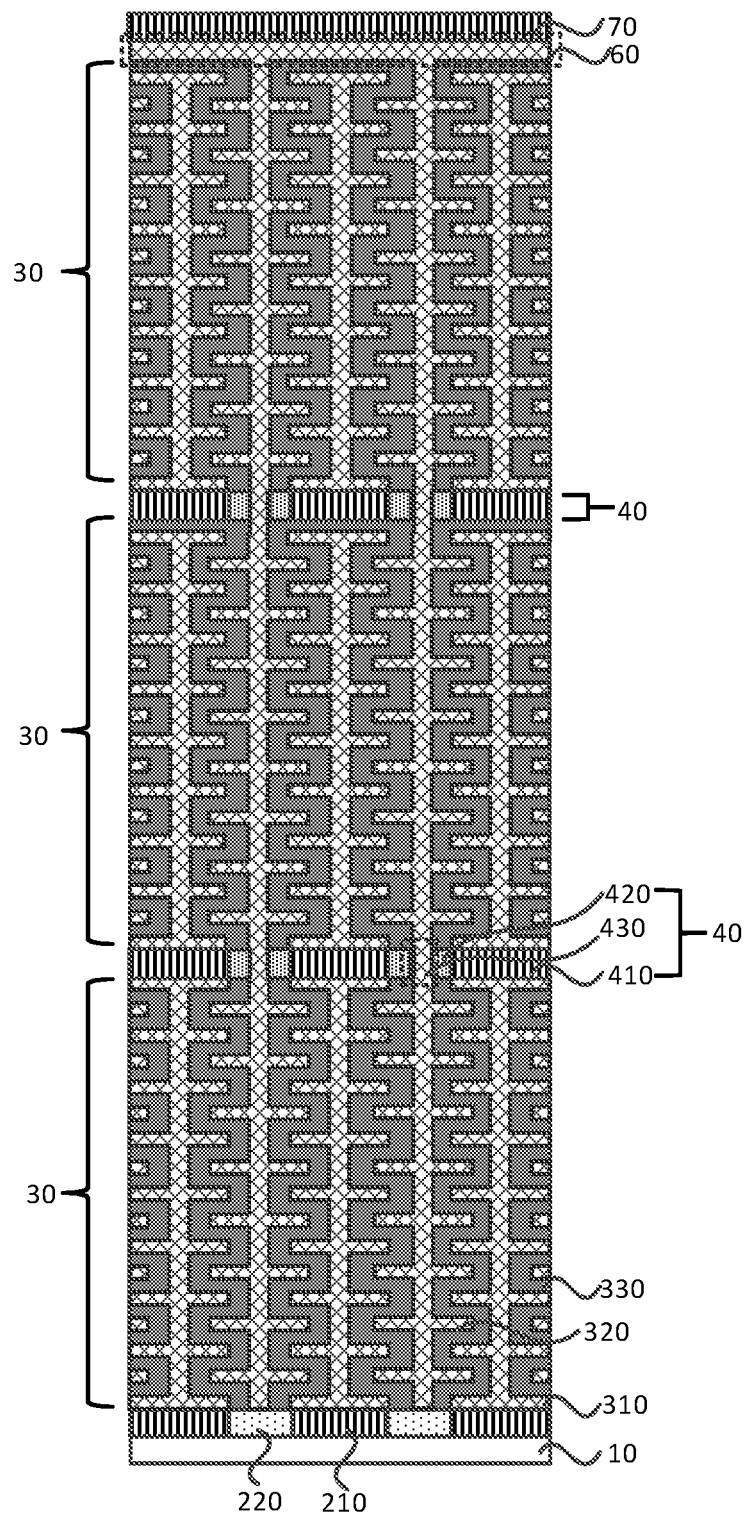
FIG. 31 is a schematic diagram of another laminated capacitor provided by an example of the present disclosure.

In some embodiments, each top electrode connection spacer 430 and the corresponding second columnar body 321 of the top electrode 320 of the sub-capacitor structure 30 on the top electrode connection spacer 430 are integrally formed. As shown in FIG. 31, on a single capacitor, the top electrode connection spacers 430 and the second columnar bodies 321 of the top electrodes 320 of the sub-capacitor structure 30 on the top electrode connection spacer 430 are formed in the same process operation. For example, the top electrode connection spacers 430 and the second columnar bodies 321 on the top electrode connection spacers 430 are simultaneously formed through adoption of a high aspect ratio filling sputtering technology. Through such arrangement, the processes may be reduced, at the same time, connection resistance is reduced, and the device performance is improved.

It will be appreciated that in the plurality of sub-capacitor structures 30 in the laminated capacitor along the direction perpendicular to the substrate 10, each bottom electrode 310 located on the same straight line is electrically connected together by the bottom electrode connection spacer 410 to constitute a bottom electrode 310 of the laminated capacitor; and, each top electrode 320 located on the same straight line is electrically connected together through the top electrode connection spacer 430 to constitute a top electrode 320 of the laminated capacitor. In this way, although height of a bottom electrode 310 in a sub-capacitor structure 30 in the vertical direction is limited due to the process condition limitation, the problem that the vertical height of s bottom electrode 310 of the laminated capacitor limited by the process condition may be solved through electrical connection of a plurality of bottom electrodes 310 to constitute a bottom electrode 310 of the laminated capacitor, so that the area of the bottom electrode 310 of the laminated capacitor is increased. Similarly, the area of a top electrode 320 of the laminated capacitor may also be increased. In this way, the effective area of the top electrodes 320 and the bottom electrodes 310 of the laminated capacitor may be increased, and the charge storage capacity of the laminated capacitor may be improved.

It is to be noted that FIG. 6 only exemplarily shows the example where N equals to 2, but is not a limitation of the present disclosure. Those skilled in the art may arrange a specific value of N according to a practical situation.

According to the method for manufacturing a laminated capacitor provided by the example of the present disclosure, at least two sub-capacitor structures 30 are stacked along the direction perpendicular to the substrate 10. The two adjacent sub-capacitor structures 30 are connected through the connection structure 40, so that the top electrodes 320 located on the same straight line are electrically connected together, and at the same time, the bottom electrodes 310 located on the same straight line are electrically connected together. That is, the plurality of stacked sub-capacitor structures 30 constitute a laminated capacitor in the vertical direction. Compared with a capacitor with one layer of sub-capacitor structure 30 in the related art, the laminated capacitor is higher in the vertical direction, the area of the top electrodes 320 and the area of the bottom electrodes 310 are larger, and therefore, the laminated capacitor has a larger capacitance value. The problems of small capacitance value and low charge storage capacity of the capacitor in the related art are solved, and the effects of increasing the capacitance value and improving the charge storage capacity are achieved.

In some embodiments, the specific preparation operations of forming the connection structure 40 and the sub-capacitor structure 30 are as follows.

A bottom electrode connection layer is formed on the sub-capacitor structure 30, and is etched to obtain a plurality of discrete bottom electrode connection spacers.

Figure 7:
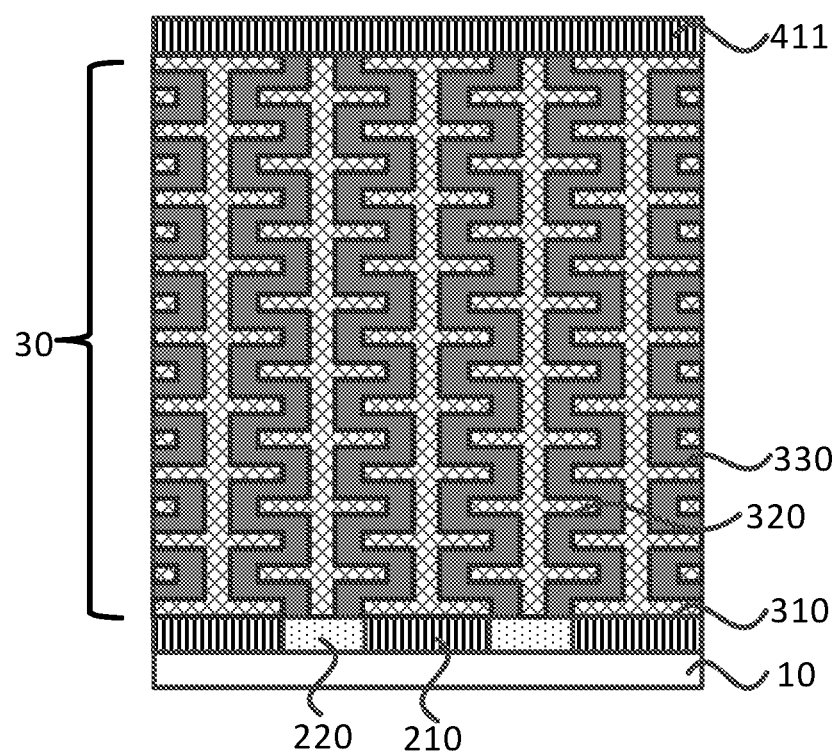
FIG. 7 is a structural schematic diagram provided by an example of the present disclosure after a bottom electrode connection layer is formed.
Figure 8:
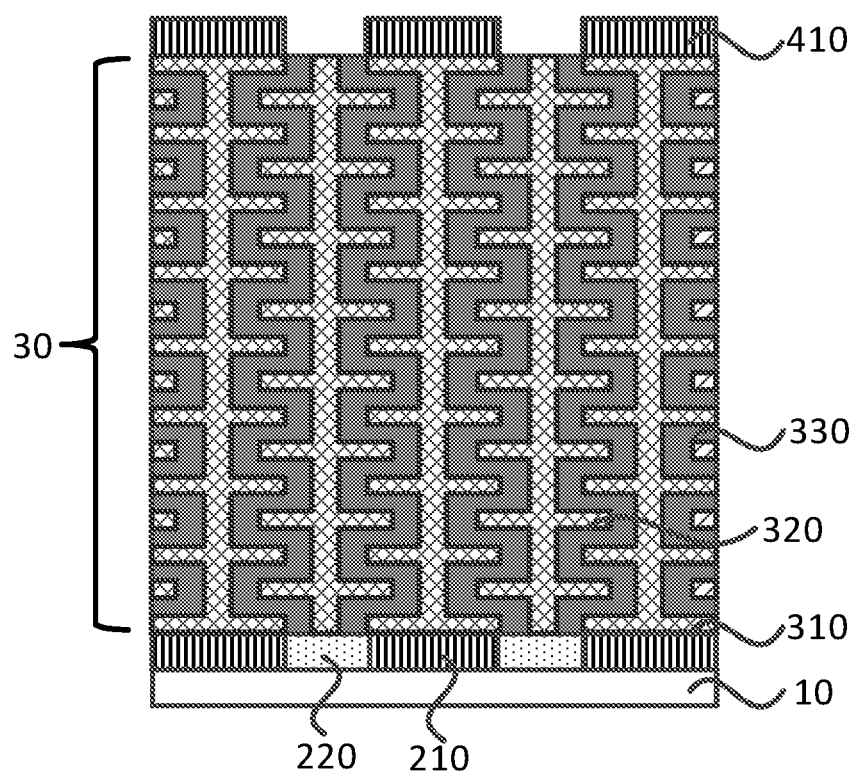
FIG. 8 is a structural schematic diagram provided by an example of the present disclosure after a bottom electrode connection spacer is formed.

In some embodiments, FIG. 7 is a structural schematic diagram provided by an example of the present disclosure after a bottom electrode connection layer is formed. FIG. 8 is a structural schematic diagram provided by an example of the present disclosure after a bottom electrode connection spacer is formed. In an embodiment, the bottom electrode connection layer 411 may be formed by depositing metal material (such as cobalt, ruthenium, platinum, iridium, palladium, and the like) through a process of atomic layer deposition (ALD), chemical vapor deposition (CVD), or physical vapor deposition (PVD). In another embodiment, the bottom electrode connection layer 411 may be etched through a lithography and etching process to form a plurality of discrete bottom electrode connection spacers 410.

A second isolation insulation spacer having openings respectively exposing the top electrodes 320 is formed between the bottom electrode connection spacers 410.

Figure 9:
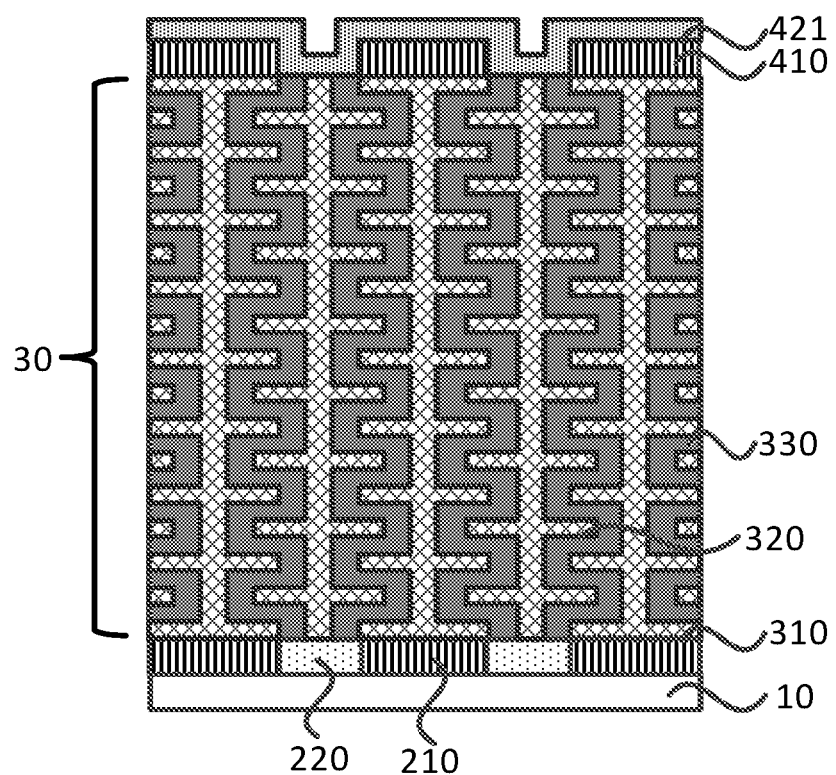
FIG. 9 is a structural schematic diagram provided by an example of the present disclosure after a second isolation insulation layer is formed.
Figure 10:
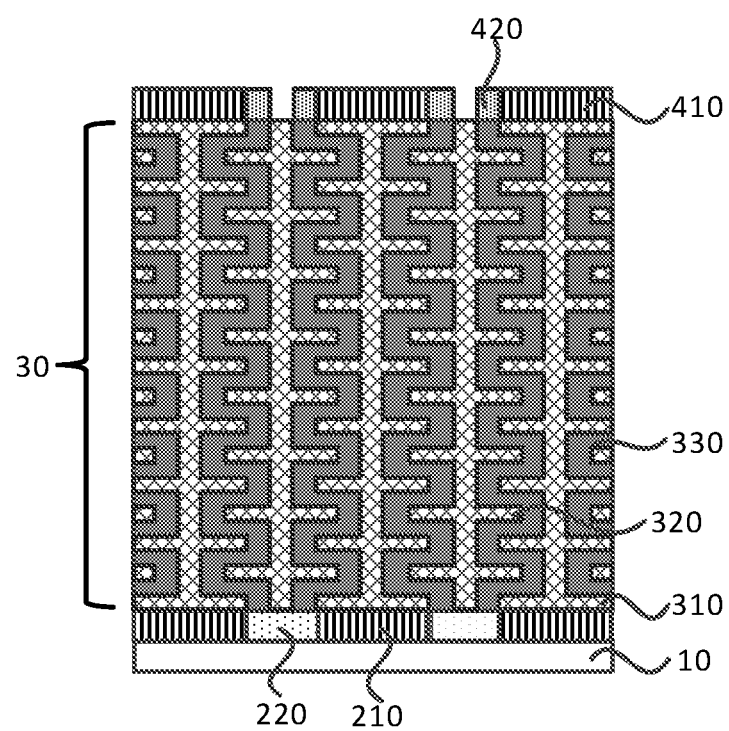
FIG. 10 is a structural schematic diagram provided by an example of the present disclosure after a second isolation insulation spacer is formed.

Specifically, as shown in FIG. 9 and FIG. 10, a second isolation insulation spacer layer 421 is formed on the top and sidewall of each bottom electrode connection spacer 410 and between the bottom electrode connection spacers 410. For example, a silicon oxide layer, a silicon nitride layer or a silicon oxynitride layer, or the like is formed with a process such as the CVD, the PVD, the ALD, and the like. The second isolation insulation spacer layer 421 on the top of the bottom electrode connection spacers 410 and between the bottom electrode connection spacers 410 is removed by dry etching to form openings respectively exposing the top electrodes 320 of the sub-capacitor structure 30 below the bottom electrode connection spacers 410. The second isolation insulation spacer layer 421 reserved on the sidewall of the bottom electrode connection spacers 410 forms the second isolation insulation spacer 420.

In some embodiments, the depth of the opening is greater than the thickness of the second isolation insulation spacer layer 421, so that when the second isolation insulation spacer layer 421 on the top of each bottom electrode connection spacer 410 and between the bottom electrode connection spacers 410 is removed by the dry etching, the second isolation insulation spacer layer 421 on the sidewall of each bottom electrode connection spacer 410 is completely or partially reserved. Preferably, the thickness of the second isolation insulation spacer layer 421 is ⅓ of the width of the opening, and the aspect ratio of the opening is greater than ⅔, so that the insulation performance of the subsequently formed second isolation insulation spacer 420 can be ensured, and at the same time, the opening with the smaller width may be generated when the second isolation insulation spacer layer 421 is formed through adoption of a self-alignment process, and the manufacturing process is simplified.

As an example, the width of the openings is the same as that of the top electrodes 320. Specifically, the width of the openings equals to the length of the opening along the direction perpendicular to the extension of the second columnar bodies 321 of the top electrodes 320. The width of the top electrodes 320 equals to the length of the second columnar bodies 321 along the direction perpendicular to the extension thereof. For example, the width of the openings may be the same as that of the top electrodes 320 above and/or below the openings, to reduce the occupied area of the top electrode connection spacer.

A top electrode connection spacer is formed in each opening.

Figure 11:
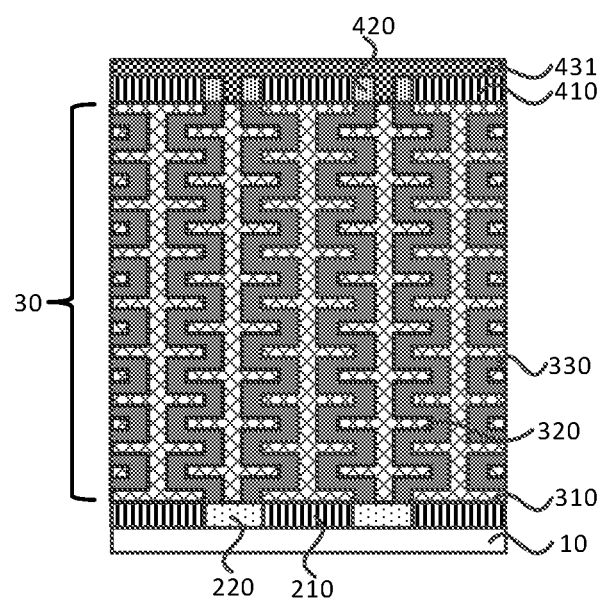
FIG. 11 is a structural schematic diagram provided by an example of the present disclosure after a top electrode connection layer is formed.

In some embodiments, FIG. 11 is a structural schematic diagram provided by an example of the present disclosure after a top electrode connection layer is formed. The top electrode connection layer 431 may be formed by depositing a metal material such as cobalt, ruthenium, platinum, iridium, palladium, and the like through the ALD, the PVD, or the CVD. The top electrode connection layer 431 is chemically-mechanically polished or etched back to expose the bottom electrode connection spacers 410 and the second isolation insulation spacer 420, and obtain a plurality of discrete top electrode connection spacers.

Figure 12:
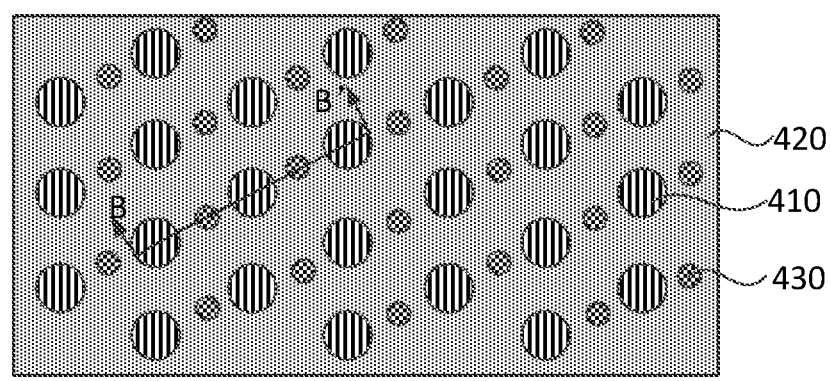
FIG. 12 is a structural schematic diagram provided by an example of the present disclosure after a top electrode connection spacer is formed.
Figure 13:
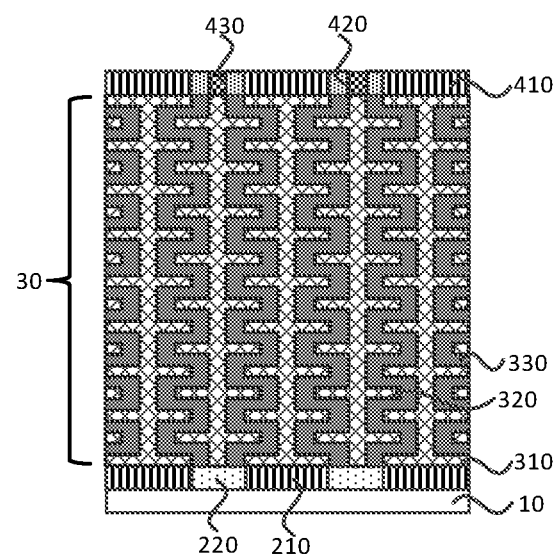
FIG. 13 is a cross-sectional view of FIG. 12 along a direction BB'.

In some embodiments, FIG. 12 is a structural schematic diagram provided by an example of the present disclosure after a top electrode connection spacer is formed. FIG. 13 is a cross-sectional view along a direction BB' of FIG. 12. In an embodiment, after the top electrode connection layer 431 above the bottom electrode connection spacers 410, the second isolation insulation spacer 420 and the top electrode connection spacers 430 is removed in a chemical-mechanical polishing or an etching-back manner, a plurality of discrete top electrode connection spacers 430 are obtained.

Figure 14:
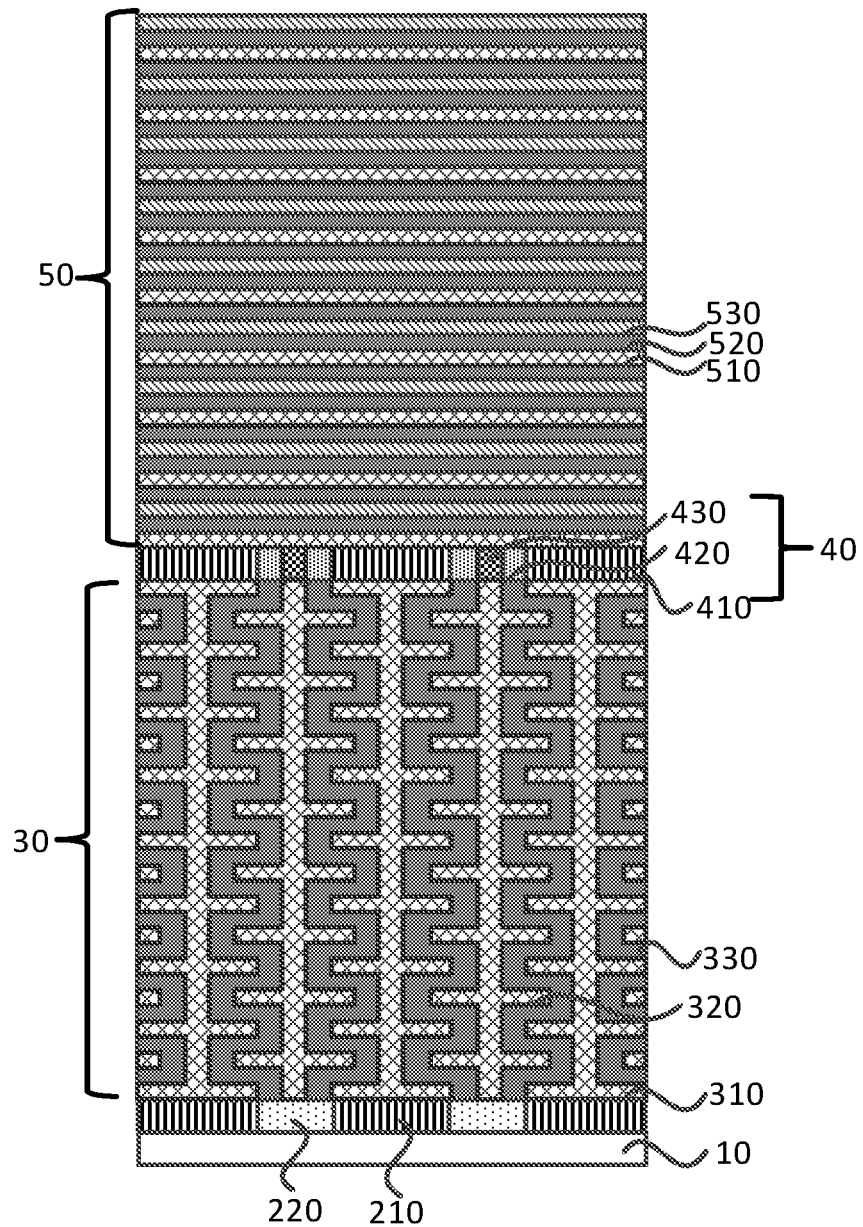
FIG. 14 is a structural schematic diagram provided by an example of the present disclosure after a sacrificial layer is formed.

In some embodiments, FIG. 14 is a structural schematic diagram provided by an example of the present disclosure after a sacrificial layer is formed. Referring to FIG. 14, a sacrificial layer 50 is formed on the connection structure 40. Along the direction perpendicular to the substrate 10, the sacrificial layer 50 includes a plurality of first film layers 510 and third film layers 530 which are alternately arranged. A second film layer 520 is interposed between the first film layer 510 and the third film layer 530. The first film layer 510 is in contact connection with the connection structure 40, and the film layer in the sacrificial layer 50 farthest away from the connection structure 40 is a third film layer 530.

In some embodiments, a first film layer 510 may be deposited as a sacrificial dielectric layer such as a silicon oxide layer, a BSG layer, a PSG layer, a BPSG layer, and or the like, or a conductive layer, such as a titanium nitride layer, a GeSi layer, and the like, through the PVD, the ALD, or the CVD. a third film layer 530 may be deposited as a sacrificial dielectric layer such as a silicon oxide layer, a BSG layer, a PSG layer, a BPSG layer, and the like, or a conductive layer, such as a titanium nitride layer, a GeSi layer, and the like through the PVD, the ALD, or the CVD. A second film layer 520 may be deposited as a high-K dielectric layer such as any one layer or any combination layer of aluminum oxide, zirconium oxide, and hafnium oxide through the PVD, the ALD, or the CVD. It is to be noted that the specific material of the first film layers 510, the second film layers 520, and the third film layers 530 may be arranged by those skilled in the art according to a practical situation, and is not limited herein.

It is to be noted that the specific number of the first film layers 510, the second film layers 520, and the third film layers 530 may be arranged by those skilled in the art according to a practical situation, and is not limited herein. The number of the first film layers 510, the second film layers 520, and the third film layers 530 for each sub-capacitor structure 30 may be same or different, and is not limited in the present disclosure.

Figure 15:
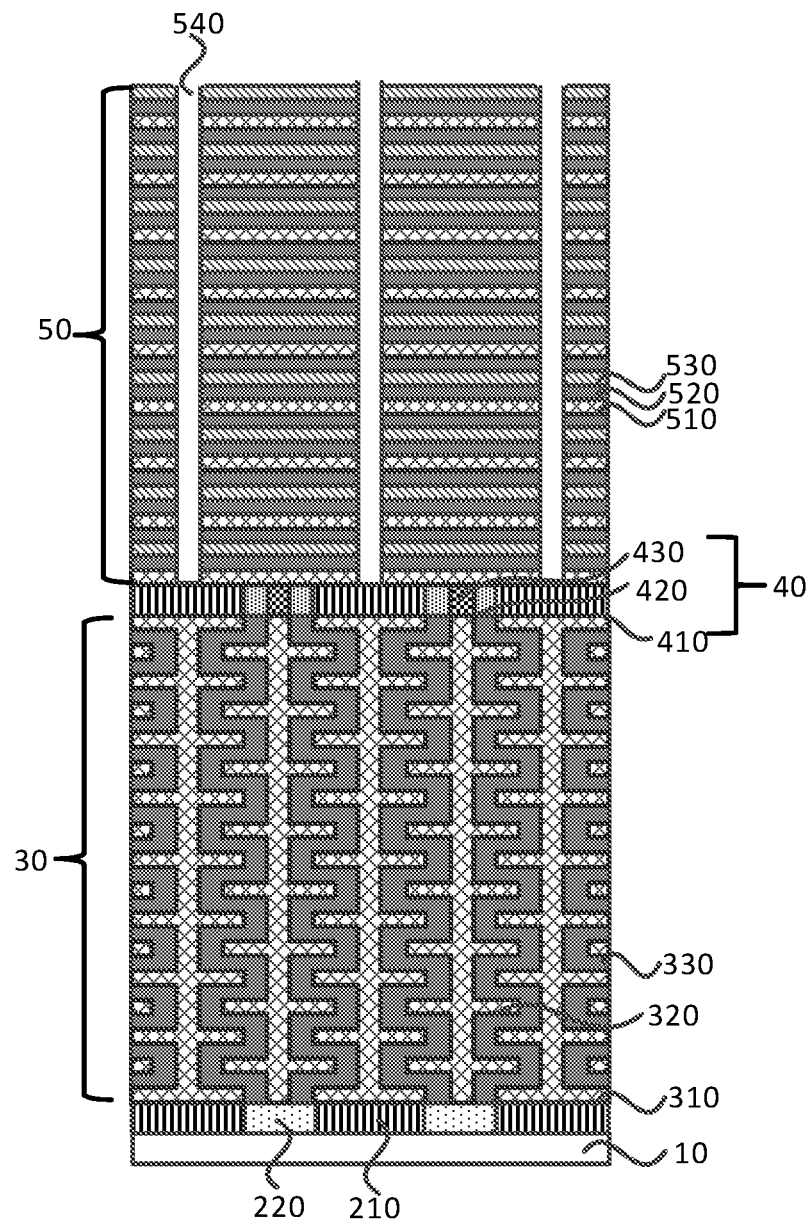
FIG. 15 is a structural schematic diagram provided by an example of the present disclosure after a first through hole is formed.

FIG. 15 is a structural schematic diagram provided by an example of the present disclosure after a first through hole is formed. Referring to FIG. 15, a plurality of discrete first through holes 540 are formed in the sacrificial layer 50 by dry etching. The first through holes 540 and the bottom electrode connection spacers 410 are in one-one correspondence. Each first through hole 540 extends to the connection structure 40 to expose a part of the corresponding bottom electrode connection spacer 410.

In some embodiments, each first through hole 540 penetrates the sacrificial layer 50. The orthographic projection of each first through hole 540 on the substrate 10 and the orthographic projection of each corresponding bottom electrode connection spacer 410 on the substrate 10 partially overlap. Exemplarily, the first through holes 540 may be formed through adoption of high aspect ratio dry etching.

The third film layers 530 are partially removed by wet etching, so that each first through hole 540 has an uneven sidewall.

Figure 16:
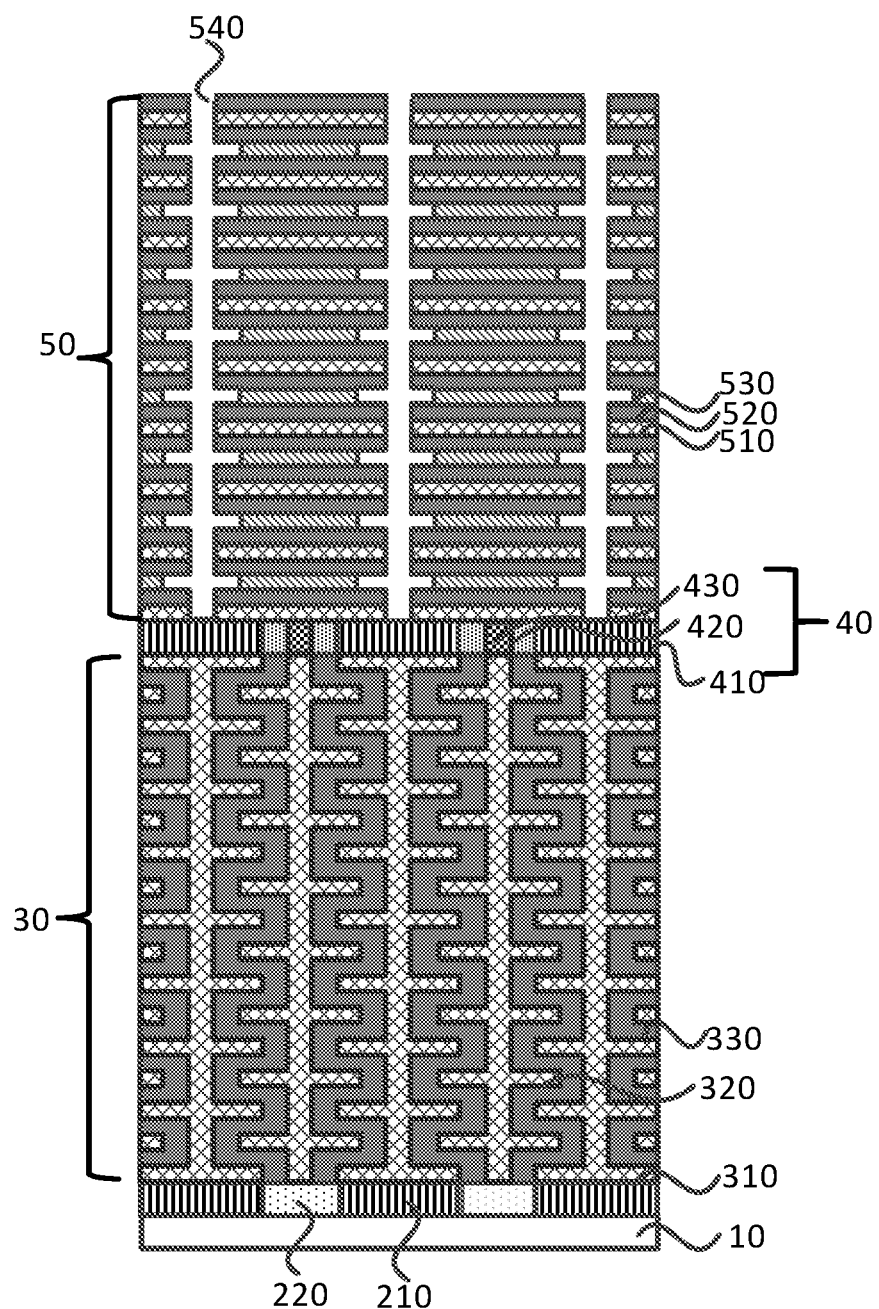
FIG. 16 is a structural schematic diagram provided by an example of the present disclosure after an uneven sidewall is formed on a first through hole.

In some embodiments, FIG. 16 is a structural schematic diagram provided by an example of the present disclosure after an uneven sidewall is formed on a first through hole. In an embodiment, the third film layers 530 forming the sidewall of each first through hole 540 may be partially etched by the wet etching, so that each first through hole 540 has an uneven sidewall.

The first through holes 540 is filled up with the material of the second film layer 520.

Figure 17:
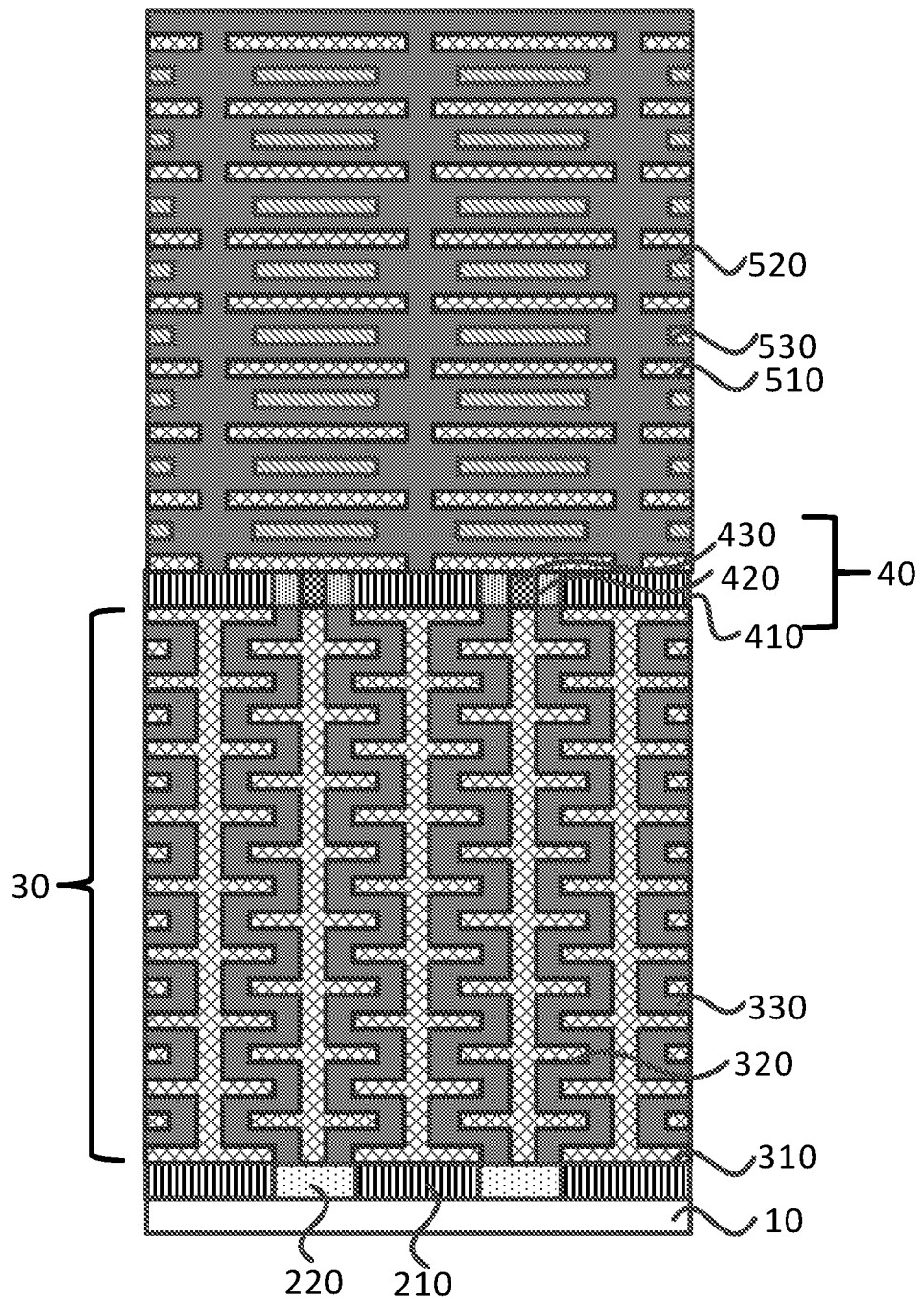
FIG. 17 is a structural schematic diagram provided by an example of the present disclosure after a first through hole is filled up with material of a second film layer.

In some embodiments, FIG. 17 is a structural schematic diagram provided by an example of the present disclosure after a first through hole is filled up with material of a second film layer. In an embodiment, the first through holes 540 may be filled up with the material of the second film layer 520 through adoption of the high aspect ratio filling sputtering technology.

Figure 18:
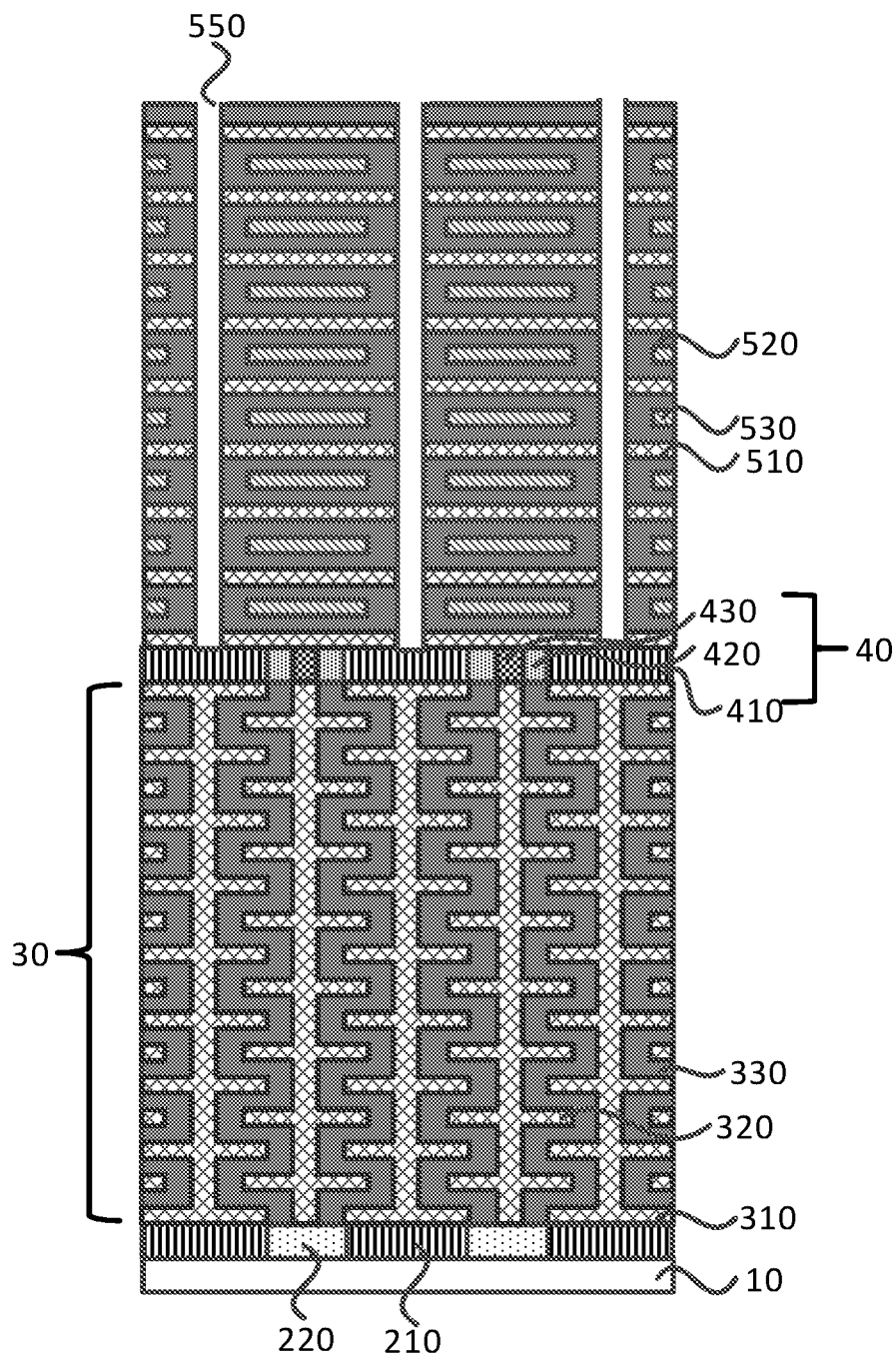
FIG. 18 is a structural schematic diagram provided by an example of the present disclosure after a second through hole is formed.

FIG. 18 is a structural schematic diagram provided by an example of the present disclosure after a second through hole is formed. Referring to FIG. 18, a plurality of discrete second through holes 550 are formed in the sacrificial layer 50 (referring to FIG. 16) by the dry etching. The arrangement location of the second through holes 550 coincides with the arrangement location of the previously formed first through holes 540 (referring to FIG. 16).

In some embodiments, the second through holes 550 may be formed through adoption of high aspect ratio dry etching.

Figure 19:
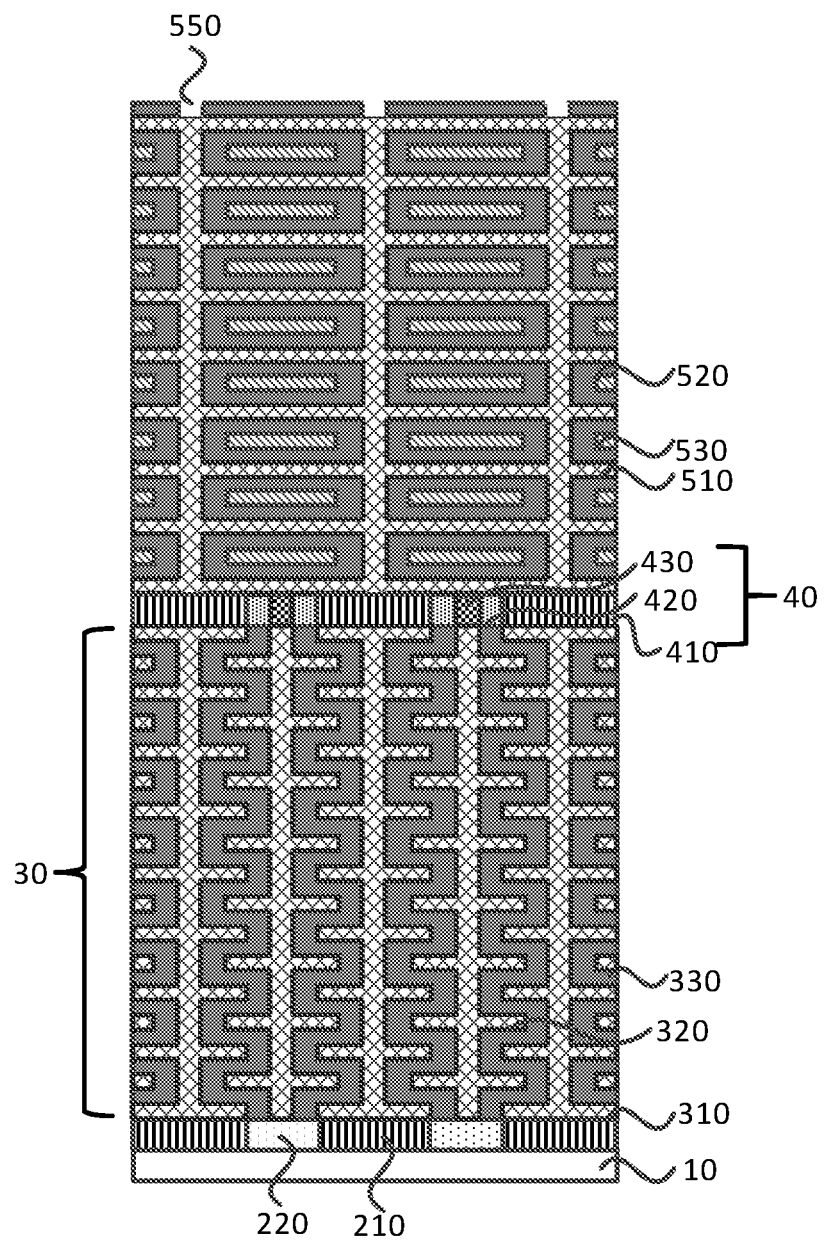
FIG. 19 is a structural schematic diagram provided by an example of the present disclosure after a second through hole is filled with material of a first film layer.

FIG. 19 is a structural schematic diagram provided by an example of the present disclosure after a second through hole is filled with material of a first film layer. Referring to FIG. 19, each second through hole 550 is filled with the material of the first film layer 510. In an embodiment, each second through holes 550 are filled with the material of the first film layer 510 until being flush with the first film layer 510 in the plurality of first film layers 510 furthest away from the connection structure 40.

In some embodiments, the second through holes 550 may be filled with the material of the first film layer 510 through adoption of the high aspect ratio filling sputtering technology, so that the first film layer 510 furthest away from the connection structure 40 has a flat upper surface.

Figure 20:
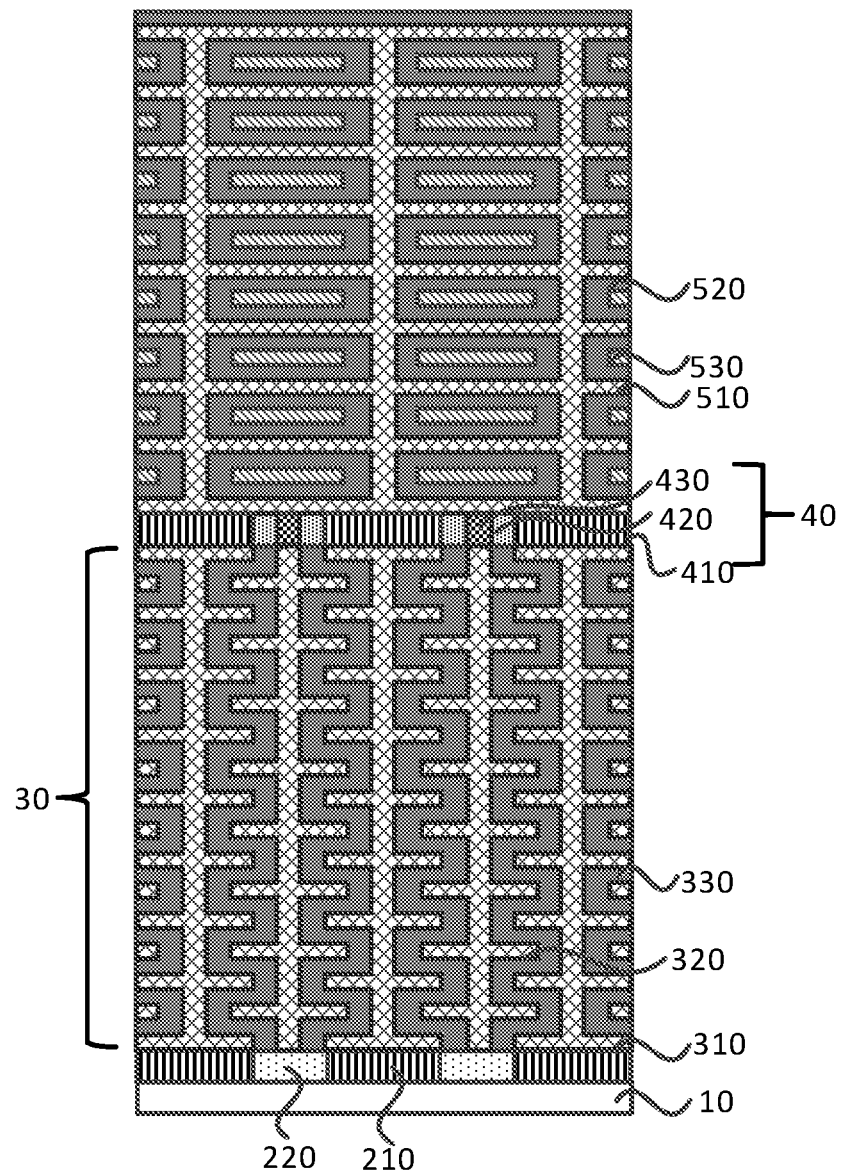
FIG. 20 is a structural schematic diagram provided by an example of the present disclosure after a second through hole is filled with material of a second film layer.

FIG. 20 is a structural schematic diagram provided by an example of the present disclosure after a second through hole is filled with material of a second film layer. Referring to FIG. 20, each second through hole 550 (referring to FIG. 19) is filled with the material of the second film layer 520. In an embodiment, the second through holes 550 are filled with the material of the second film layer 520 until being flush with the second film layer 520 in the plurality of second film layers 520 furthest away from the connection structure 40.

In some embodiments, the second through hole 550 may be filled with the material of the second film layer 520 through adoption of the ALD, the CVD, or the PVD, so that the second film layer 520 furthest away from the connection structure 40 has a flat upper surface.

Figure 21:
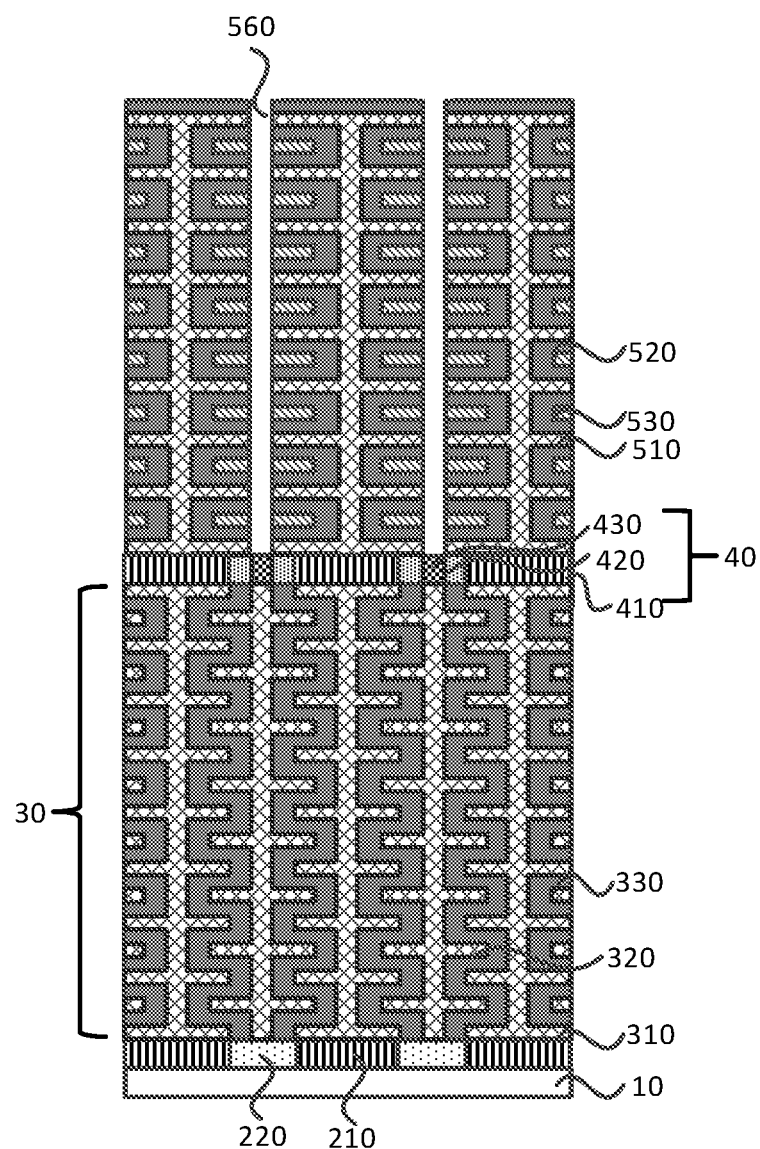
FIG. 21 is a structural schematic diagram provided by an example of the present disclosure after a third through hole is formed.

FIG. 21 is a structural schematic diagram provided by an example of the present disclosure after a third through hole is formed. Referring to FIG. 21, a plurality of discrete third through holes 560 are formed in the sacrificial layer 50 (referring to FIG. 16) by the dry etching. The third through holes 560 and the top electrode connection spacers 430 are in one-one correspondence. Each third through hole 560 extends to the connection structure 40 to expose at least a part of the corresponding top electrode connection spacer 430.

Referring to FIG. 21, the third through holes 560 penetrates the sacrificial layer 50. The orthographic projection of the third through hole 560 on the substrate 10 and the orthographic projection of the top electrode connection spacers 430 on the substrate 10 at least partially overlap. In an embodiment, the third through holes 560 may be formed through adoption of high aspect ratio dry etching.

Figure 22:
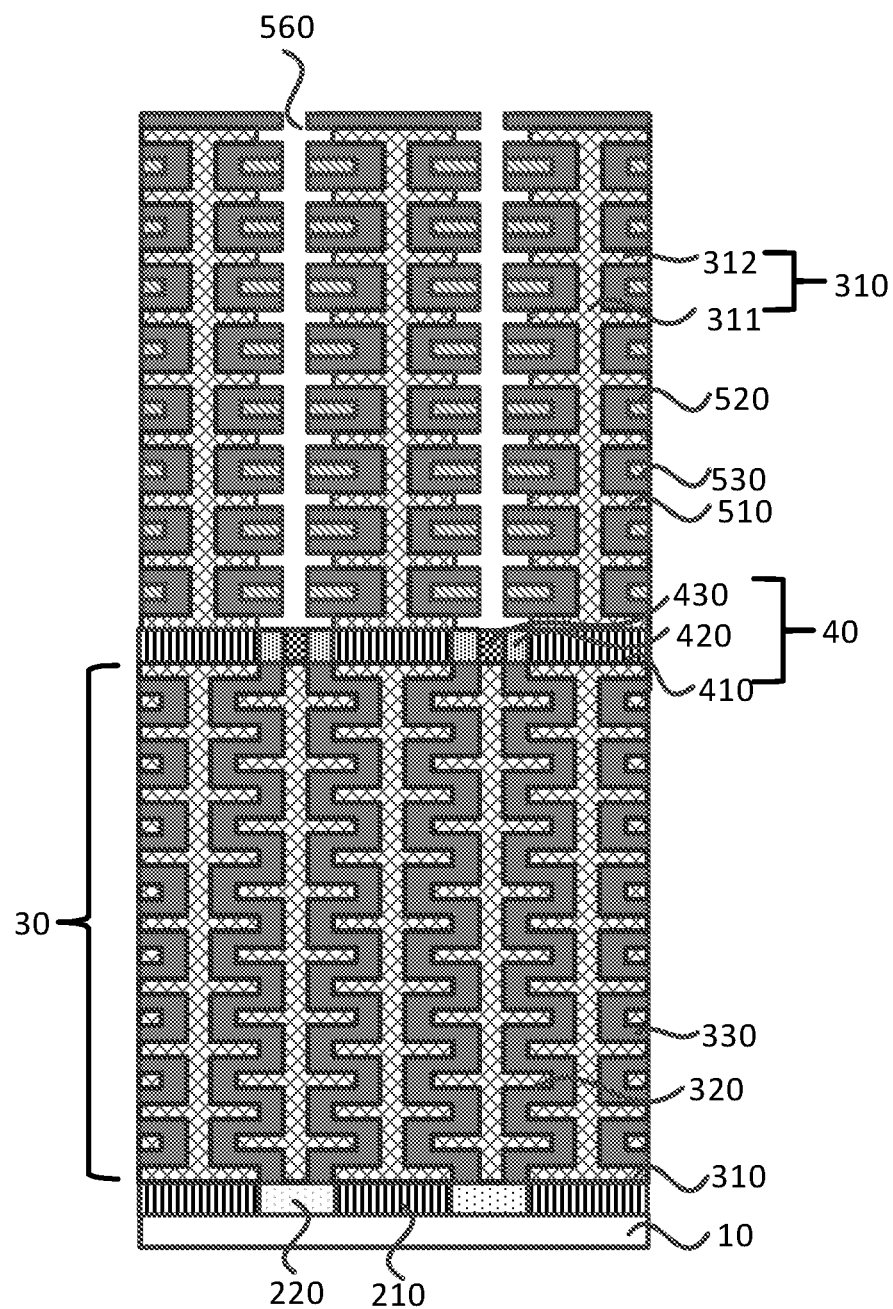
FIG. 22 is a structural schematic diagram provided by an example of the present disclosure after an uneven sidewall is formed on a third through hole.

FIG. 22 is a structural schematic diagram provided by an example of the present disclosure after an uneven sidewall is formed on a third through hole. Referring to FIG. 22, the wet etching is performed to partially remove the first film layer 510 constituting the sidewall of the third through hole 560, so that the third through hole 560 has an uneven sidewall, and a plurality of discrete bottom electrodes 310 are obtained. Each bottom electrode 310 includes a first columnar body 311 and multilayer first annular side wings 312 connected to the sidewall of the first columnar body 311.

The first film layer 510 forming the sidewall of each third through hole 560 may be partially etched by the wet etching, so that each third through hole 560 has an uneven sidewall.

Figure 23:
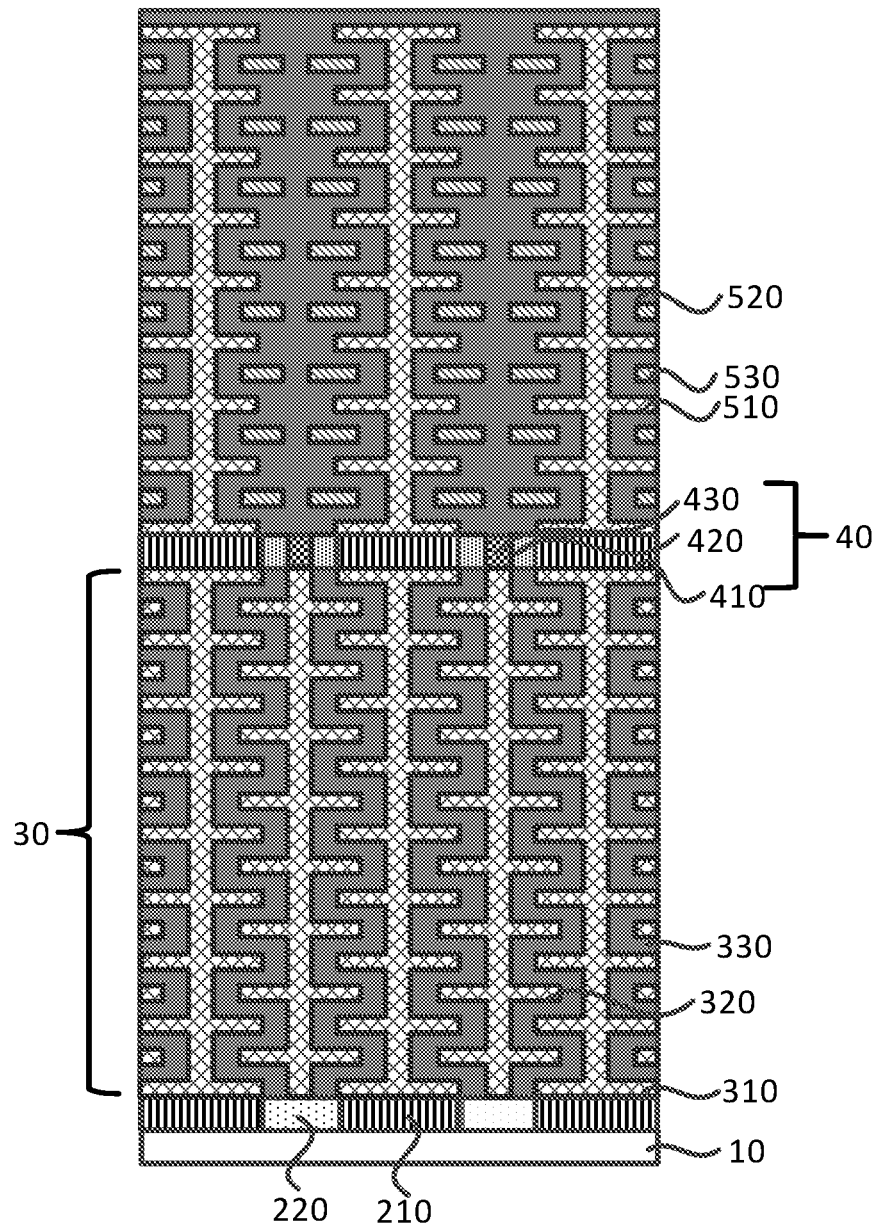
FIG. 23 is a structural schematic diagram provided by an example of the present disclosure after a third through hole is filled up with material of a second film layer.

FIG. 23 is a structural schematic diagram provided by an example of the present disclosure after a third through hole is filled up with material of a second film layer 520. Referring to FIG. 23, the third through holes 560 (referring to FIG. 22) are filled up with the material of the second film layer 520.

In some embodiments, the third through hole 560 may be filled up with the material of the second film layer 520 through adoption of the high aspect ratio filling sputtering technology.

Figure 24:
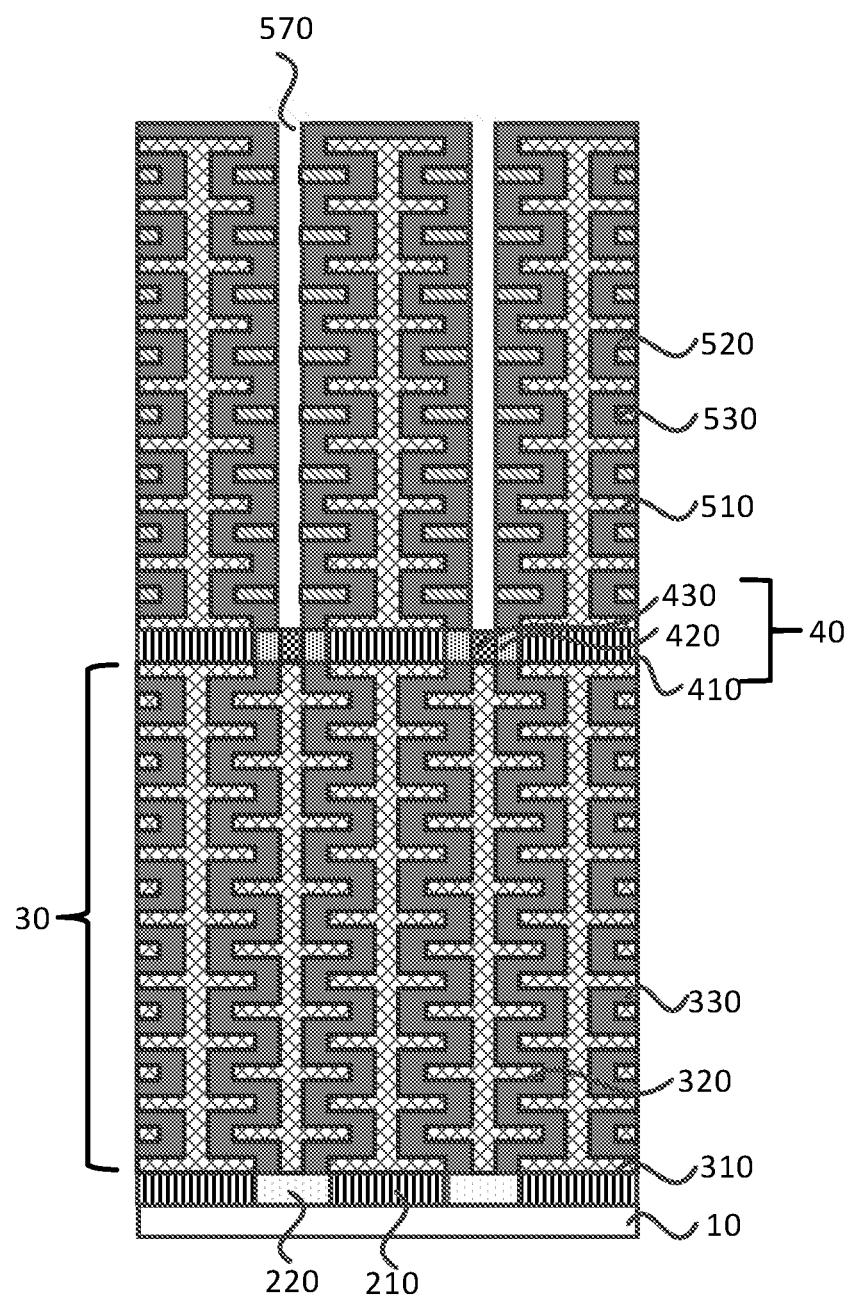
FIG. 24 is a structural schematic diagram provided by an example of the present disclosure after a fourth through hole is formed.

FIG. 24 is a structural schematic diagram provided by an example of the present disclosure after a fourth through hole is formed. Referring to FIG. 24, a plurality of discrete fourth through holes 570 are formed in the sacrificial layer 50 (referring to FIG. 16) by the dry etching. The arrangement location of the fourth through holes 570 coincides with the arrangement location of the previously formed third through holes 560 (referring to FIG. 22).

Referring to FIG. 24, each fourth through hole 570 penetrates the sacrificial layer 50 to expose the corresponding top electrode connection spacer 430. In an embodiment, the fourth through holes 570 may be formed through adoption of the high aspect ratio dry etching.

Figure 25:
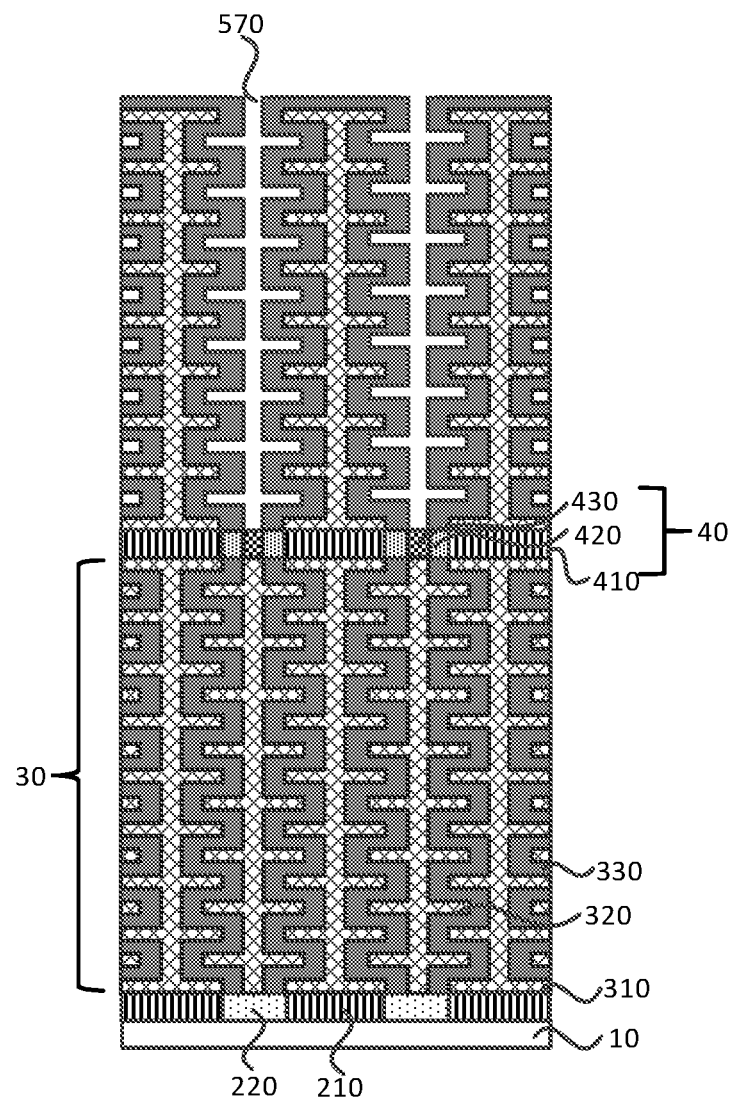
FIG. 25 is a structural schematic diagram provided by an example of the present disclosure after the entire second film layer is removed.

FIG. 25 is a structural schematic diagram provided by an example of the present disclosure after a third film layer is removed. Referring to FIG. 25, the wet etching is performed to remove the third film layer 530.

In some embodiments, the third film layer 530 in the sacrificial layer 50 may be removed by the wet etching.

Figure 26:
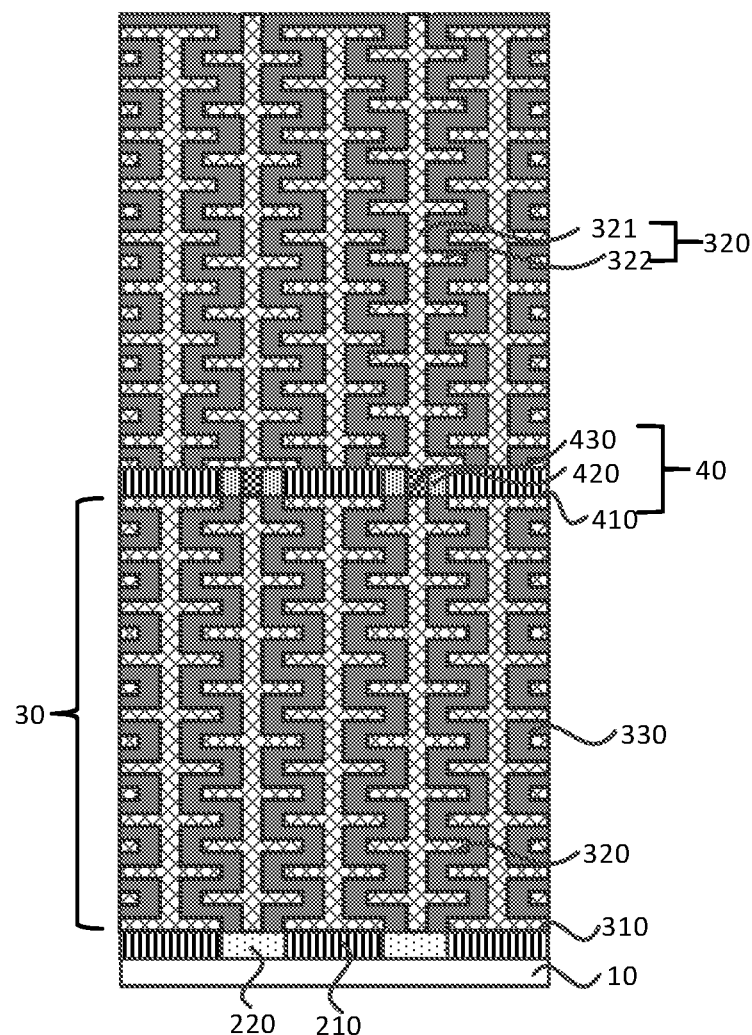
FIG. 26 is a structural schematic diagram provided by an example of the present disclosure after a top electrode is formed.

FIG. 26 is a structural schematic diagram provided by an example of the present disclosure after a top electrode is formed. Referring to FIG. 26, the fourth through holes 570 is filled up with the material of the first film layer 510 to obtain a plurality of discrete top electrodes 320. Each top electrode 320 includes a second columnar body 321 and multilayer second annular side wings 322 connected to the sidewall of the second columnar body 321.

In some embodiments, the fourth through holes 570 may be filled up with the material of the first film layer 510 through adoption of the high aspect ratio filling sputtering technology.

So far, the operation of "forming the connection structure 40 and the sub-capacitor structure 30" is completed by illustration from FIG. 7 to FIG. 26.

In another example, specific preparation operations of forming the connection structure 40 and the sub-capacitor structure 30 are as follows.

A bottom electrode connection layer 411 is formed on the sub-capacitor structure 30, and the bottom electrode connection layer 411 is etched to obtain a plurality of discrete bottom electrode connection spacers 410.

A second isolation insulation spacer 420 having an opening exposing the top electrode is formed between the bottom electrode connection spacers 410.

The operation of forming the bottom electrode connection spacers 410 and the second isolation insulation spacer 420 are shown in FIG. 7-FIG. 10 and will not be described in detail herein.

A third isolation insulation column is formed in the opening.

Figure 27:
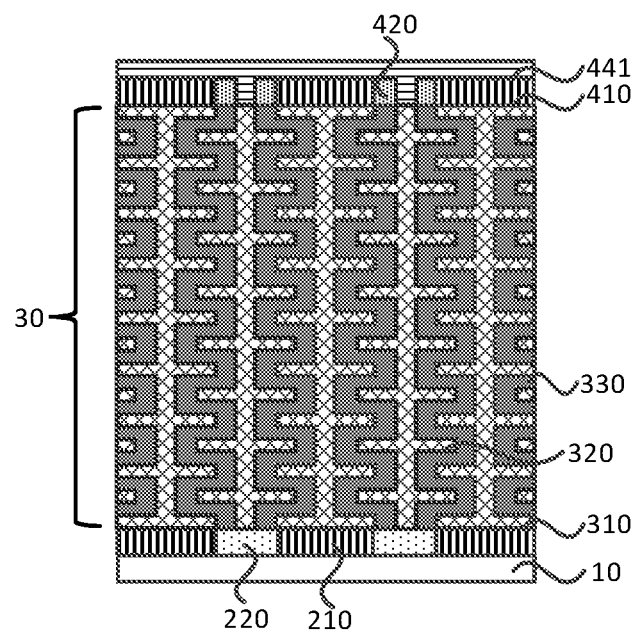
FIG. 27 is a structural schematic diagram provided by an example of the present disclosure after a third isolation insulation layer is formed.

FIG. 27 is a structural schematic diagram provided by an example of the present disclosure after a third isolation insulation layer is formed. In an embodiment, the third isolation insulation layer 441 may be formed by depositing the material (such as silicon nitride, silicon oxide, and the like) through the CVP or the ALD. It is to be noted that the second isolation insulation spacer 420 and the third isolation insulation layer 441 are different in material. The third isolation insulation layer 441 is processed by an etching or chemical-mechanical polishing process to expose the bottom electrode connection spacers 410 and the second isolation insulation spacer 420, and obtain a plurality of discrete third isolation insulation columns.

Figure 28:
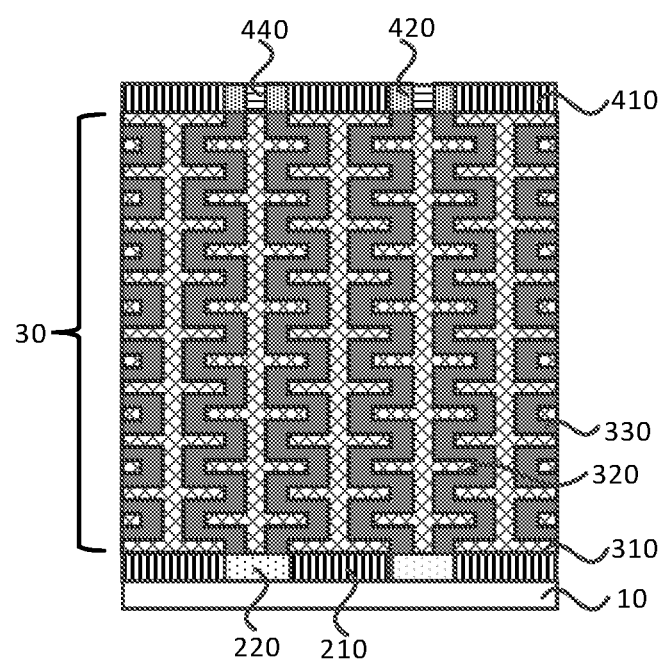
FIG. 28 is a structural schematic diagram provided by an example of the present disclosure after a third isolation insulation column is formed.

In some embodiments, FIG. 28 is a structural schematic diagram provided by an example of the present disclosure after a third isolation insulation column is formed. In an embodiment, after the material of the third isolation insulation layer 441 above the bottom electrode connection spacer 410, the second isolation insulation spacer 420, and the third isolation insulation column 440 are removed in an etching or chemical-mechanical polishing process, a plurality of discrete third isolation insulation columns 440 are obtained.

The sacrificial layer 50 is formed on the bottom electrode connection spacers 410, the second isolation insulation spacer 420, and the third isolation insulation columns 440. Along the direction perpendicular to the substrate 10, the sacrificial layer 50 includes a plurality of first film layers 510 and third film layers 530 which are alternately arranged. A second film layer 520 is interposed between the first film layer 510 and the third film layer 530. The first film layer 510 is in contact connection with the connection structure 40.

The operation of forming the sacrificial layer 50 is shown in FIG. 14 and will not be described in detail herein.

A plurality of discrete first through holes 540 are formed in the sacrificial layer 50 by dry etching. The first through holes 540 and the bottom electrodes connection spacer 410 are in one-one correspondence. Each first through hole 540 extends to the connection structure 40 to expose a part of the bottom electrode connection spacer 410.

The operation of forming the first through holes 540 is shown in FIG. 15 and will not be described in detail herein.

The plurality of third film layers 530 are partially removed by wet etching, so that each first through hole 540 has an uneven sidewall.

The operation of forming each first through hole 540 with an uneven sidewall is shown in FIG. 16 and will not be described in detail herein.

The first through holes 540 is filled up with the material of the second film layer 520.

The above operation is shown in FIG. 17 and will not be described in detail herein.

A plurality of discrete second through holes 550 are formed in the sacrificial layer 50 by the dry etching. The arrangement location of the second through holes 550 coincide with the arrangement location of the previously formed first through holes 540.

The operation of forming the second through holes 550 is shown in FIG. 18 and will not be described in detail herein.

The second through holes 550 are filled with the material of the first film layer 510. In an embodiment, the second through holes 550 are filled with the material of the first film layer 510 until being flush with the first film layer 510 in the plurality of first film layers 510 furthest away from the connection structure 40.

The above operation is shown in FIG. 19 and will not be described in detail herein.

The second through holes 550 are filled with the material of the second film layer 520. In an embodiment, the second through holes 550 are filled with the material of the second film layer 520 until being flush with the second film layer 520 in the plurality of second film layers 520 furthest away from the connection structure 40.

The above operation is shown in FIG. 20 and will not be described in detail herein.

A plurality of discrete third through holes 560 are formed in the sacrificial layer 50 by the dry etching. The third through holes 560 and the third isolation insulation columns 440 are in one-one correspondence. Each third through hole 560 extends to the connection structure 40 to expose the corresponding third isolation insulation column 440.

The operation of forming the third through holes 560 is shown in FIG. 21 and will not be described in detail herein. Specifically, the third through holes 560 penetrate the sacrificial layer 50. The orthographic projection of the third through holes 560 on the substrate 10 and the orthographic projection of the third isolation insulation columns 440 on the substrate 10 at least partially overlap.

The wet etching is performed to partially remove the first film layer 510 constituting the sidewall of each third through hole 560, so that each third through hole 560 has an uneven sidewall, and a plurality of discrete bottom electrodes 310 are obtained. Each bottom electrode 310 includes a first columnar body 311 and multilayer first annular side wings 312 connected to the sidewall of the first columnar body 311.

The above operation is shown in FIG. 22 and will not be described in detail herein.

The third through holes 560 are filled up with the material of the second film layer 520.

The above operation is shown in FIG. 23 and will not be described in detail herein.

A plurality of discrete fourth through holes 570 are formed in the sacrificial layer 50 by the dry etching. The arrangement location of the fourth through holes 570 coincides with the arrangement location of the previously formed third through holes 560.

The operation of forming the fourth through holes 570 is shown in FIG. 24 and will not be described in detail herein.

Figure 29:
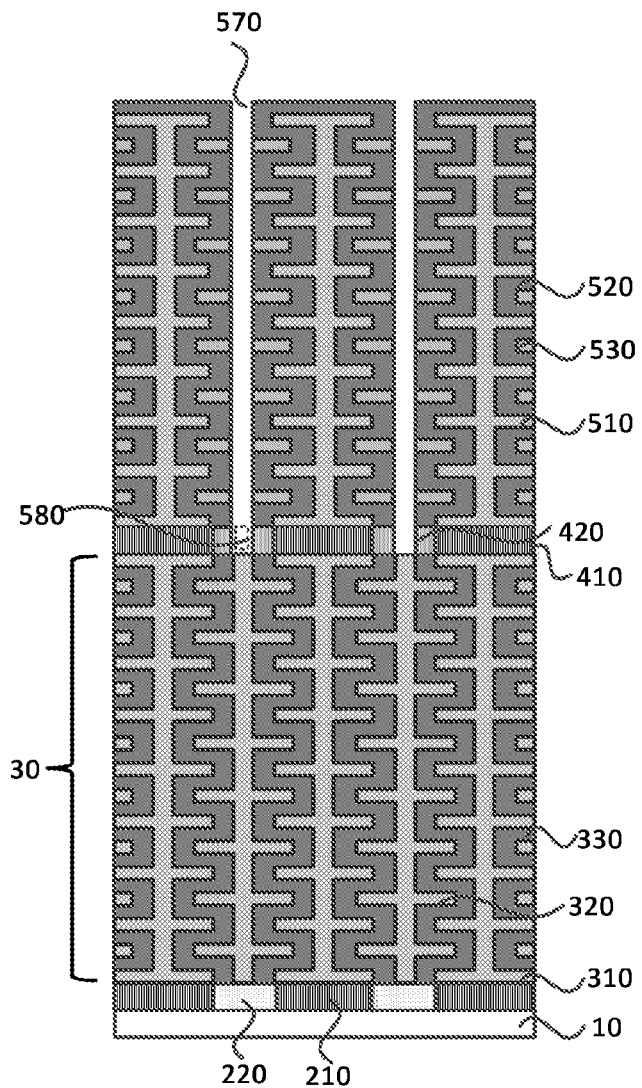
FIG. 29 is a structural schematic diagram provided by an example of the present disclosure after a fifth through hole is formed.

FIG. 29 is a structural schematic diagram provided by an example of the present disclosure after a fifth through hole is formed. Referring to FIG. 29, a plurality of discrete fifth through holes 580 are formed in the connection structure 40 by the wet etching to expose the top electrodes 320. Each fifth through hole 580 is communicated with the corresponding fourth through hole 570.

In some embodiments, the fifth through holes 580 is formed by etching the third isolation insulation column 440 (referring to FIG. 28) of the connection structure 40 in a wet etching manner. The fifth through holes 580 and the third isolation insulation columns 440 are in one-to-one correspondence. Since the fifth through holes 580 are located at the bottom of the sub-capacitor structure 30 thereon through adoption of the wet etching, the third isolation insulation columns 440 may be removed better, and at the same time, the damage to the top electrodes 320 of the sub-capacitor structure 30 below the third isolation insulation column 440 is reduced. Specifically, the vertical projection of the fifth through holes 580 on the substrate 10 and the vertical projection of the bottom electrode connection spacers 410 on the substrate 10 do not overlap, and the fifth through holes 580 and the bottom electrode connection spacers 410 are spaced by the second isolation insulation spacer 420.

The wet etching is performed to remove the entire third film layer 530.

The above operation is shown in FIG. 25 and will not be described in detail herein.

Figure 30:
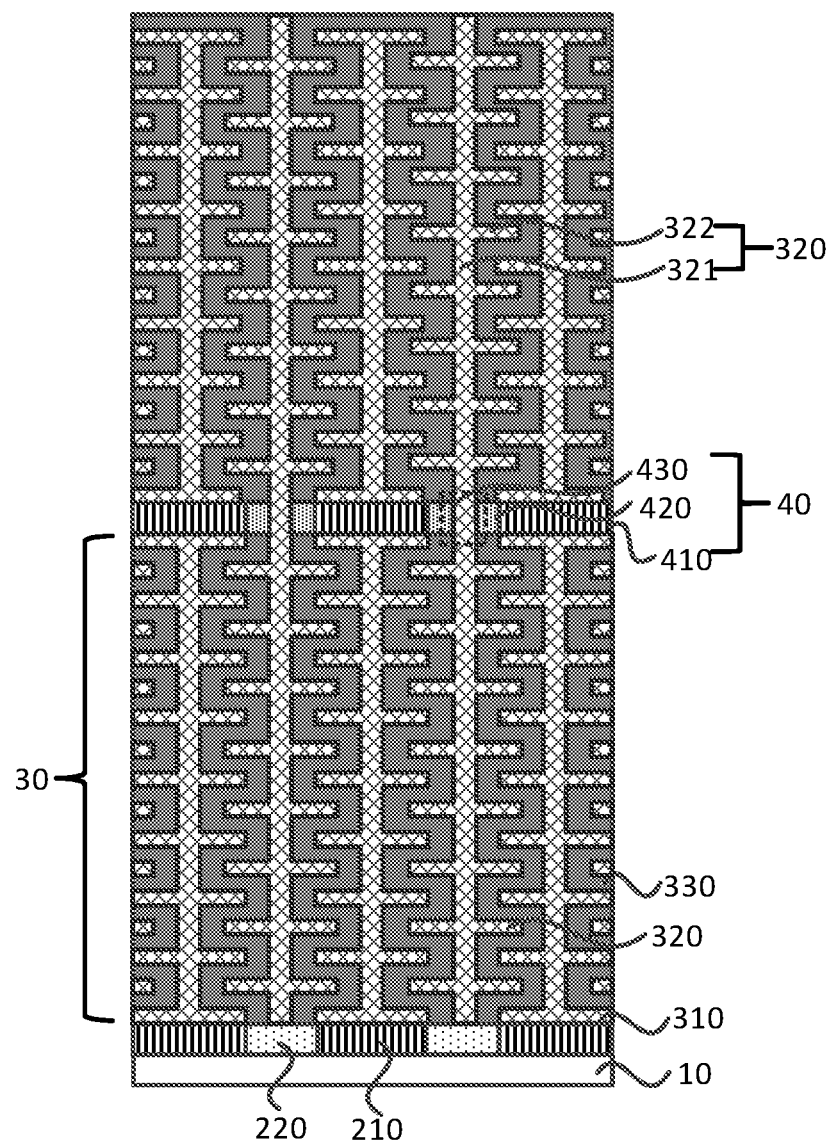
FIG. 30 is a structural schematic diagram provided by an example of the present disclosure after a top electrode and a top electrode connection spacer are formed.

FIG. 30 is a structural schematic diagram provided by an example of the present disclosure after a top electrode and a top electrode connection spacer are formed. Referring to FIG. 30, the fourth through holes 570 and the fifth through holes 580 are filled up with the material of the first film layer 510 to obtain a plurality of discrete top electrodes 320 and a plurality of discrete top electrode connection spacers 430. Each top electrode 320 includes a second columnar body 321 and multilayer second annular side wings 322 connected to the sidewall of the second columnar body 321.

In some embodiments, the fourth through holes 570 and the fifth through holes 580 may be filled up with the material of the first film layer 510 through adoption of the high aspect ratio filling sputtering technology. When each fifth through hole 580 is filled up with the material of the first film layer 510, each top electrode connection spacer 430 is formed, and when each fourth through hole 570 is filled up with the material of the first film layer 510, each top electrode 320 is formed. Each top electrode connection spacer 430 and the corresponding top electrode 320 thereon are integrally formed.

So far, the operation of "forming the connection structure 40 and the sub-capacitor structure 30" is completed by illustration of FIG. 7 to FIG. 25 and FIG. 27 to FIG. 30.

On the basis of the above technical solution, optionally, after the operation of forming the connection structure 40 and the sub-capacitor structure 30 is repeatedly performed for N times, the method further includes that: a top electrode connection structure is formed on the sub-capacitor structure 30. The discrete top electrodes 320 are integrally connected by the top electrode connection structure.

In some embodiments, FIG. 31 is a structural schematic diagram of another laminated capacitor provided by an example of the present disclosure. Referring to FIG. 31, optionally, the material of the top electrode connection structure 60 is the same as that of the top electrode 320. In this way, the top electrode connection structure 60 and the top electrodes 320 may be formed in the same process operation, so that the preparation process of the laminated capacitor is simplified, and the efficiency is improved.

On the basis of the above technical solution, with continued reference to FIG. 31, optionally, the method further includes that: a top bonding pad 70 is formed on the top electrode connection structure 60. The top bonding pad 70 is electrically connected with the top electrode connection structure 60.

Specifically, thickness, material and a preparation process of the top bonding pad 70 may be arranged by those skilled in the art according to a practical situation, and are not limited by the present disclosure.

On the basis of the same application concept, an example of the present disclosure also provides a laminated capacitor. Referring to FIG. 6 and FIG. 31, the laminated capacitor includes: a substrate 10; a first isolation insulation spacer 220 and a plurality of discrete bottom bonding pads 210 located on the substrate 10, any two bottom bonding pads 210 being spaced by the first isolation insulation spacer 220; and N connection structures 40 and N+1 sub-capacitor structures 30 located on a surface of the bottom bonding pad 210 deviating away from the substrate 10, where N is an integer greater than or equal to 1. The N connection structures 40 and the N+1 sub-capacitor structures 30 are alternately arranged along a direction perpendicular to the substrate 10. The sub-capacitor structure 30 includes a plurality of discrete bottom electrodes 310, a plurality of discrete top electrodes 320, and a dielectric medium 330 located between the bottom electrodes 310 and the top electrodes 320. The plurality of bottom bonding pads 210 are electrically connected with the plurality of bottom electrodes 310 of the sub-capacitor structure 30 closest to the bottom bonding pad 210 in one-to-one correspondence.

With continued reference to FIG. 6 and FIG. 31, the connection structure 40 includes a second isolation insulation spacer 420, a plurality of discrete bottom electrode connection spacers 410, and a plurality of discrete top electrode connection spacers 430. Any one bottom electrode connection spacer 410 and any one top electrode connection spacer 430, any two bottom electrode connection spacers 410, and any two top electrode connection spacers 430 are respectively spaced by the second isolation insulation spacer 420. Along the direction perpendicular to the substrate 10, each bottom electrode connection spacer 410 is electrically connected to two bottom electrodes 310 adjacent to the bottom electrode connection spacer 410, and each top electrode connection spacer 430 is electrically connected to two top electrodes 320 adjacent to the top electrode connection spacer 430.

Referring to FIG. 5, optionally, each bottom electrode 310 includes a first columnar body 311 and multilayer first annular side wings 312 connected to the sidewall of the first columnar body 311. Each layer of first annular side wing 312 is discretely arranged. Each top electrode 320 includes a second columnar body 321 and multilayer second annular side wings 322 connected to the sidewall of the second columnar body 321. Each layer of second annular side wing 322 is discretely arranged.

With continued reference to FIG. 6 and FIG. 31, optionally, a width of the top electrode connection spacers 430 is the same as that of the second columnar bodies 321. Specifically, the length of the top electrode connection spacers 430 along the direction perpendicular to the extension of the second columnar body 321 (referring to FIG. 5) is the same as that of the second columnar bodies 321 in the direction perpendicular to the extension thereof, in order to reduce occupied area of the top electrode connection spacer 430.

With continued reference to FIG. 6 and FIG. 31, optionally, each bottom electrode connection spacer 410 is in direct contact with the corresponding first annular side wing 312 (referring to FIG. 5) of the bottom electrode 310 of the sub-capacitor structure 30 adjacent to the bottom electrode connection spacer 410, so as to increase a process alignment window. Specifically, each bottom electrode connection spacer 410 is in direct contact with the first annular side swing 312 of the bottom electrode 310 of the sub-capacitor structure 30 above the bottom electrode connection spacer 410, and at the same time, each bottom electrode connection spacer 410 is in direct contact with the corresponding first annular side wing 312 of the bottom electrode 310 of the sub-capacitor structure 30 below the bottom electrode connection spacer 410.

With continued reference to FIG. 6 and FIG. 31, optionally, the projection of an edge of each bottom electrode connection spacer 410 and an edge of the corresponding first annular side wing 312 (referring to FIG. 5) on the substrate 10 coincide, to reduce the occupied area of each bottom electrode connection spacer 410 and ensure good contact.

With continued reference to FIG. 6 and FIG. 31, optionally, material of the top electrode connection spacers 430 is the same as that of the top electrodes 320. For example, both the material of the top electrode connection spacers 430 and the material of the top electrodes 320 are conductive material such as titanium nitride, and the like. Through adoption of the same material, contact resistance may be reduced, and the device performance may be improved.

Optionally, each top electrode connection spacer 430 and the corresponding second columnar body 321 of the top electrode 320 of the sub-capacitor structure 30 thereon are integrally formed. As shown in FIG. 31, on a single capacitor, each top electrode connection spacer 430 and the corresponding second columnar body 321 (referring to FIG. 5) of the top electrode 320 of the sub-capacitor structure 30 thereon are formed in the same process operation. For example, each top electrode connection spacer 430 and the corresponding second columnar body 321 thereon are simultaneously formed through adoption of a high aspect ratio filling sputtering technology. Through such arrangement, the process operation may be reduced, at the same time, connection resistance is reduced, and the device performance is improved.

With continued reference to FIG. 6 and FIG. 31, optionally, the orthographic projection of each top electrode connection spacer 430 on the substrate 10 and the orthographic projection of the corresponding second columnar body 321 (referring to FIG. 5) on the substrate 10 coincide.

With continued reference to FIG. 6 and FIG. 31, optionally, the laminated capacitor further includes: a top electrode connection structure 60 located on the surface away from the substrate 10 of the sub-capacitor structure 30 farthest away from the substrate 10. Each discrete top electrode 320 is integrally connected by the top electrode connection structure 60.

With continued reference to FIG. 6 and FIG. 31, optionally, the laminated capacitor further includes: a top bonding pad 70 located on a surface of the top electrode connection structure 60 away from the substrate 10. The top bonding pad 70 is electrically connected with the top electrode connection structure 60.

It is to be noted that the laminated capacitor described in the examples of the present disclosure is formed by the method for manufacturing a laminated capacitor described above, and therefore, the laminated capacitor has the same beneficial effects as the method for manufacturing a laminated capacitor. The part which is not explained in detail refers to the above, and will not be described in detail herein.

It is to be noted that the foregoing is only preferred examples of the present disclosure and the employed technical principles. It will be understood by those skilled in the art that the present disclosure is not limited to the specific examples described herein. Various apparent changes, rearrangements, combinations, and substitutions can be performed by those skilled in the art without departing from the scope of the protection of the present disclosure. Therefore, although the present disclosure has been described in more detail through the above examples, the present disclosure is not limited to the above examples, but may further include other equivalent examples without departing from the spirit of the present disclosure, and the scope of the present disclosure is determined by the scope of the appended claims.

The invention claimed is:

1. A method for manufacturing a laminated capacitor, comprising:
    providing a substrate;
    forming a first isolation insulation spacer and a plurality of discrete bottom bonding pads arranged in the first isolation insulation spacer on the substrate;
    forming a first sub-capacitor structure on the first isolation insulation spacer and the bottom bonding pads, which comprises a plurality of discrete bottom electrodes, a plurality of discrete top electrodes, and a dielectric medium located between the bottom electrodes and the top electrodes, wherein the plurality of bottom bonding pads are respectively electrically connected with the plurality of bottom electrodes in one-to-one correspondence; and
    performing an operation of sequentially forming a $n^{th}$ connection structure and a $n^{th}$ sub-capacitor structure on the first sub-capacitor structure from n=1 to n=N, wherein N is an integer greater than or equal to 1, wherein the laminated capacitor finally has N connection structures and N+1 sub-capacitor structures which are alternately arranged along a direction perpendicular to the substrate.

2. The method for manufacturing a laminated capacitor of claim 1, wherein the connection structures comprises a second isolation insulation spacer, a plurality of discrete bottom electrode connection spacers, and a plurality of discrete top electrode connection spacers;

wherein along the direction perpendicular to the substrate, each bottom electrode connection spacer is electrically connected with two bottom electrodes adjacent thereto, and each top electrode connection spacer is electrically connected with two top electrodes adjacent thereto.

3. The method for manufacturing a laminated capacitor of claim 2, wherein forming the connection structure on the sub-capacitor structure comprises:

forming the plurality of discrete bottom electrode connection spacers on the sub-capacitor structure;

forming the second isolation insulation spacer between the bottom electrode connection spacers, which has openings respectively exposing the top electrodes; and forming the top electrode connection spacers in the openings.

4. The method for manufacturing a laminated capacitor of claim 3, wherein forming the second isolation insulation spacer between the bottom electrode connection spacers, in which the second isolation insulation spacer has the openings respectively exposing the top electrodes comprises:

forming a second isolation insulation spacer layer on a top and a sidewall of each of the bottom electrode connection spacers, and between the bottom electrode connection spacers; and removing the second isolation insulation spacer layer on the top of each of the bottom electrode connection spacers and between the bottom electrode connection spacers by dry etching to form the openings respectively exposing the top electrodes, wherein the second isolation insulation spacer layer reserved on the sidewall of each of the bottom electrode connection spacers form the second isolation insulation spacer.

5. The method for manufacturing a laminated capacitor of claim 4, wherein a width of the openings is the same as a width of the top electrodes.

6. The method for manufacturing a laminated capacitor of claim 2, wherein forming the connection structure on the sub-capacitor structure comprises:

forming the plurality of discrete bottom electrode connection spacers on the sub-capacitor structure;

forming the second isolation insulation spacer between the bottom electrode connection spacers, which has openings respectively exposing the top electrodes;

forming third isolation insulation columns respectively in the openings;

forming a sacrificial layer on the bottom electrode connection spacers, the second isolation insulation spacer, and the third isolation insulation columns; and forming the sub-capacitor structure in the sacrificial layer, and forming the top electrode connection spacers respectively at locations of the third isolation insulation columns, wherein the top electrodes of the sub-capacitor structure and the top electrode connection spacers are integrally formed.

7. The method for manufacturing a laminated capacitor of claim 6, wherein the third isolation insulation columns are removed by a wet etching process, and the top electrode connection spacers are respectively formed at locations where the third isolation insulation columns had been present.

8. The method for manufacturing a laminated capacitor of claim 1, further comprising: after repeatedly performing the operation of sequentially forming the $n^{th}$ connection structure and the $n^{th}$ sub-capacitor structure for N times, forming a top electrode connection structure on the $N^{th}$ sub-capacitor structure, which integrally connects the discrete top electrodes.

9. The method for manufacturing a laminated capacitor according to claim 8, further comprising: forming a top bonding pad on the top electrode connection structure, wherein the top bonding pad being electrically connected with the top electrode connection structure.

10. A laminated capacitor, comprising:

a substrate;

a first isolation insulation spacer and a plurality of discrete bottom bonding pads arranged in the first isolation insulation spacer on the substrate;

N connection structures and N+1 sub-capacitor structures located on the first isolation insulation spacer and the bottom bonding pads, wherein N is an integer greater than or equal to 1, and the N+1 sub-capacitor structures and the N connection structures are alternately arranged along a direction perpendicular to the substrate;

wherein each of the sub-capacitor structures comprises a plurality of discrete bottom electrodes, a plurality of discrete top electrodes, and a dielectric medium between the bottom electrodes and the top electrodes; and the plurality of bottom bonding pads are respectively electrically connected with the plurality of bottom electrodes of a sub-capacitor structure adjacent to the plurality of bottom bonding pads in one-to-one correspondence.

11. The laminated capacitor of claim 10, wherein each of the connection structures comprises a second isolation insulation spacer, a plurality of discrete bottom electrode connection spacers, and a plurality of discrete top electrode connection spacers, wherein along the direction perpendicular to the substrate, each of the bottom electrode connection spacers is electrically connected with two bottom electrodes adjacent to the bottom electrode connection spacer, and each of the top electrode connection spacers is electrically connected with two top electrodes adjacent thereto.

12. The laminated capacitor of claim 11, wherein each of the bottom electrodes comprises a first columnar body, and multiple layers of first annular side wings connected to a sidewall of the first columnar body, in which each layer of the first annular side wing is discretely arranged; and each of the top electrodes comprises a second columnar body, and multiple layers of second annular side wings connected to a sidewall of the second columnar body, in which each layer of the second annular side wing is discretely arranged.

13. The laminated capacitor of claim 12, wherein a width of the top electrode connection spacers is the same as a width of the second columnar bodies.

14. The laminated capacitor of claim 13, wherein material of the top electrode connection spacers is the same as material of the top electrodes.

15. The laminated capacitor of claim 14, wherein each top electrode connection spacer and the second columnar body of each top electrode on the top electrode connection spacer are integrally formed.

16. The laminated capacitor of claim 12, wherein an orthographic projection of each of the top electrode connection spacers on the substrate and an orthographic projection of a corresponding second columnar body on the substrate coincide.

17. The laminated capacitor of claim 12, wherein
   each of the bottom electrode connection spacer of a connection structure is in direct contact with the first annular side wing of the bottom electrode adjacent thereto of the sub-capacitor structure.

18. The laminated capacitor of claim 17, further comprising:
   a projection of an edge of each bottom electrode connection spacer and a projection of an edge of the corresponding first annular side wing on the substrate coincide.

19. The laminated capacitor of claim 10, further comprising:
   a top electrode connection structure, located on a surface away from the substrate of the sub-capacitor structure farthest away from the substrate, which integrally connects discrete top electrodes.

20. The laminated capacitor of claim 19, further comprising:
   a top bonding pad, located on a surface of the top electrode connection structure away from the substrate, which electrically connects with the top electrode connection structure.

\* \* \* \* \*